(12) United States Patent
Choi et al.

(10) Patent No.: US 11,264,977 B1
(45) Date of Patent: Mar. 1, 2022

(54) ZERO-CROSSING DETECTOR FOR DC-DC CONVERTER SYSTEMS AND METHODS

(71) Applicant: SYNAPTICS INCORPORATED, San Jose, CA (US)

(72) Inventors: Jae Won Choi, Irvine, CA (US); Dan Shen, Irvine, CA (US); Balakishan Challa, Irvine, CA (US); Lorenzo Crespi, Irvine, CA (US); Ketan Patel, Irvine, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 17/184,409

(22) Filed: Feb. 24, 2021

(51) Int. Cl.
| | |
|---|---|
| *H03K 5/1536* | (2006.01) |
| *G01R 19/175* | (2006.01) |
| *H02M 1/08* | (2006.01) |
| *H02M 1/00* | (2006.01) |

(52) U.S. Cl.
CPC ......... *H03K 5/1536* (2013.01); *G01R 19/175* (2013.01); *H02M 1/082* (2013.01); *H02M 1/083* (2013.01); *H02M 1/0009* (2021.05)

(58) Field of Classification Search
CPC ... H03K 5/1536; G01R 19/175; H02M 1/082; H02M 1/083; H02M 1/0009
USPC .......................................................... 327/79
See application file for complete search history.

(56) References Cited

U.S. PATENT DOCUMENTS

2011/0221414 A1\* 9/2011 Pigott ................. H02M 3/1588
                                                                323/283

\* cited by examiner

*Primary Examiner* — Tomi Skibinski
(74) *Attorney, Agent, or Firm* — Paradice & Li LLP

(57) ABSTRACT

Embodiments described herein provide a zero-crossing detector (ZCD) for a direct current to direct current (DC-DC) converter. The ZCD includes a ZCD integrator configured to receive a switch voltage and an output voltage of a power stage of the DC-DC converter and to generate a zero-crossing detect signal based, at least in part, on the received switch voltage and output voltage, where the zero-crossing detect signal is configured to indicate an output current in an output inductor of the power stage of the DC-DC converter is approximately zero. The ZCD may also include a ZCD offset calibrator configured to receive the switch voltage and generate a ZCD calibration offset based, at least in part, on the received switch voltage, where the ZCD integrator is configured to generate the zero-crossing detect signal based, at least in part, on the ZCD calibration offset.

18 Claims, 12 Drawing Sheets

US 11,264,977 B1

ZERO-CROSSING DETECTOR FOR DC-DC CONVERTER SYSTEMS AND METHODS

TECHNICAL FIELD

The present application generally relates to direct current to direct current (DC-DC) converters, and more particularly, for example, to systems and methods for zero-crossing detection and related timing in discontinuous conduction mode DC-DC converters.

BACKGROUND

Power converters, including direct current to direct current (DC-DC) converters, are used to power a wide variety of electronic devices. The loads drawn by such electronic devices vary from device to device and can vary over time within each device. Some electronic devices and/or modules within the electronic devices may present a light load and draw minimal current, and other electronic devices/modules may present a heavy load and draw significantly more current. Such loads may also vary within the same device or between interconnected devices based on usage and mode. As a particular load varies, conventional switch mode DC-DC converters often produce voltage ripples and/or radio frequency interference that negatively impacts device performance. Moreover, conventional switch mode DC-DC converters often suffer from a variety of inefficient operational modes. Thus, there is a need in the art for improvements in DC-DC converters to reduce these and other negative effects.

SUMMARY

The present disclosure describes improved direct current to direct current (DC-DC) converters, including improved systems and methods for regulating the output of DC-DC converters.

In one embodiment, a DC-DC converter may include a DC-DC converter controller configured to receive an output voltage of the DC-DC converter and adjust a switching frequency of the DC-DC converter in response to an output load status of the DC-DC converter. An output load sensor may be configured to determine the output load status and provide a peak current target value to the DC-DC controller, where the output load sensor includes a first timer configured to provide a delayed first signal to a peak current controller in response to the output load being a heavy load, a second timer configured to provide a delayed second signal to the peak current controller in response to the output load being a light load, and the peak current controller configured to adjust the peak current target value based, at least in part, on the received first signal and the second signal, and configured to provide the peak current target value to the DC-DC converter controller.

In another embodiment, a method may include measuring a timing between a first switching cycle of a DC-DC converter and a second switching cycle of the DC-DC converter, determining whether the second switching cycle occurs before expiration of a first predetermined time, and incrementing a peak current target value when the second switching cycle occurs before expiration of the first predetermined time.

In one embodiment, a zero-crossing detector (ZCD) for a DC-DC converter includes a ZCD integrator configured to receive a switch voltage and an output voltage of a power stage of the DC-DC converter and to generate a zero-crossing detect signal based, at least in part, on the received switch voltage and output voltage, wherein the zero-crossing detect signal is configured to indicate an output current in an output inductor of the power stage of the DC-DC converter is approximately zero. In various embodiments, the ZCD may also include a ZCD offset calibrator configured to receive the switch voltage and generate a ZCD calibration offset based, at least in part, on the received switch voltage, where the ZCD integrator is configured to generate the zero-crossing detect signal based, at least in part, on the ZCD calibration offset. The ZCD may also include an idle release generator configured to receive the switch voltage and an input voltage for the power stage of the DC-DC converter and to generate an idle release signal based, at least in part, on the received switch voltage and input voltage, wherein the idle release signal is configured to indicate the DC-DC converter is ready to exit an idle mode of the DC-DC converter.

In another embodiment, a method of operating a ZCD for a DC-DC converter may include receiving, by a ZCD integrator of the ZCD, a switch voltage and an output voltage of a power stage of the DC-DC converter, and generating a zero-crossing detect signal based, at least in part, on the received switch voltage and output voltage, where the zero-crossing detect signal is configured to indicate an output current in an output inductor of the power stage of the DC-DC converter is approximately zero. In various embodiments, the method may include receiving, by a ZCD offset calibrator of the ZCD, the switch voltage, and generating a ZCD calibration offset based, at least in part, on the received switch voltage, where the generating the zero-crossing detect signal is based, at least in part, on the ZCD calibration offset. The method may also include receiving, by an idle release generator, the switch voltage and an input voltage for the power stage of the DC-DC converter, and generating an idle release signal based, at least in part, on the received switch voltage and input voltage, where the idle release signal is configured to indicate the DC-DC converter is ready to exit an idle mode of the DC-DC converter.

The scope of the present disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

Figure 1:
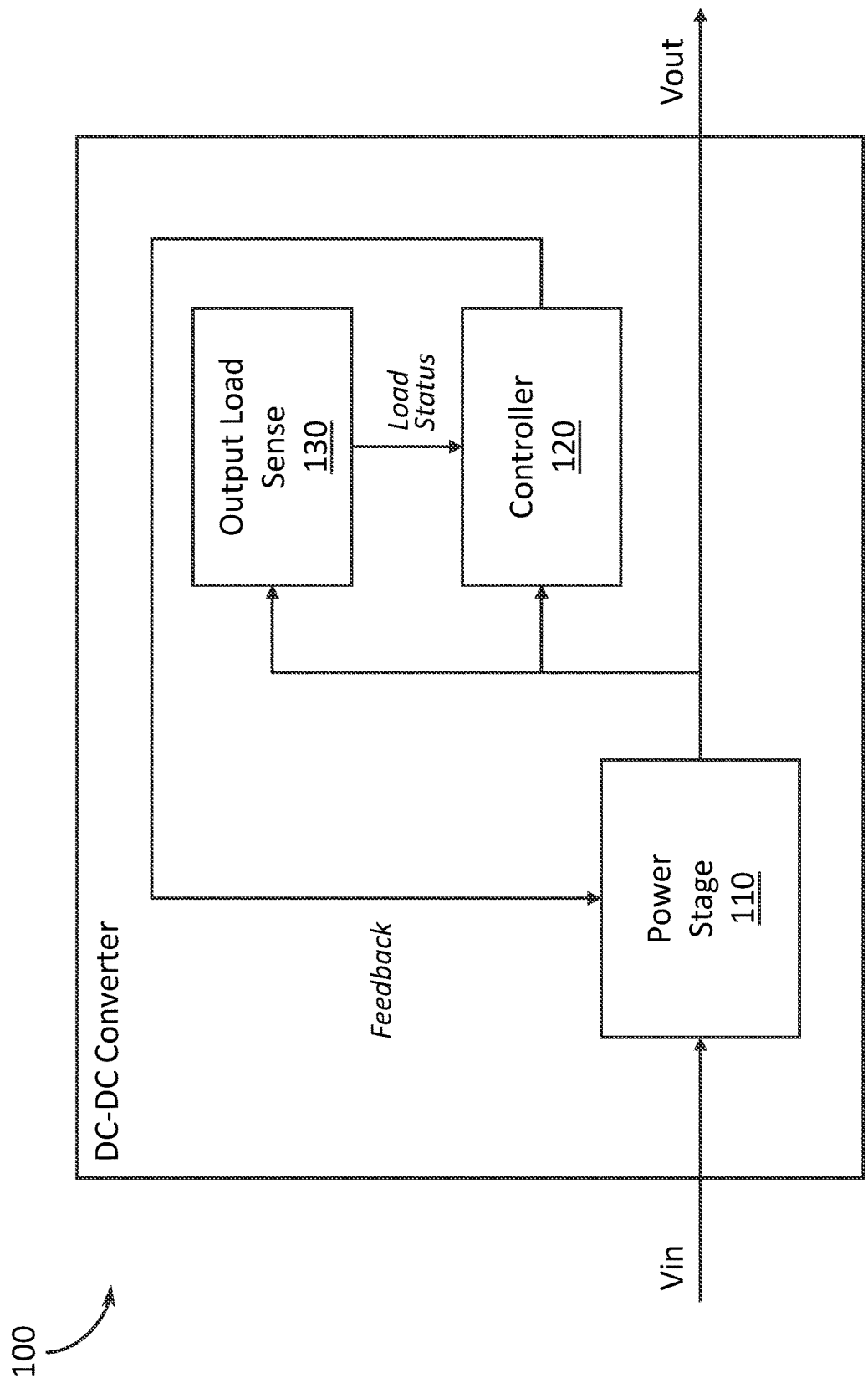
FIG. 1 is a block diagram of a direct current to direct current (DC-DC) converter, in accordance with an embodiment of the present disclosure.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

A direct current to direct current (DC-DC) power converter ("converter") generally receives an input voltage at a first voltage level and converts the input voltage to an output voltage at a second voltage level. For example, a "buck" converter may receive a 5V input voltage and generate a lower or bucked 1.5V output voltage, and a "boost" converter may receive a 5V input voltage and generate a higher or boosted 7V output voltage. The output of the DC-DC converter may be coupled to a load, which may include an electronic device and/or various components of an electronic device, such as components for a music player, a tablet device, a cell phone, and/or other electronic device or devices. Embodiments of the present disclosure provide systems and techniques to monitor an output load status (e.g., a heavy, light, or good/median load status) and regulate the output voltage and the switching frequency of the DC-DC converter according to the appropriate load status. Embodiments of the present disclosure also provide systems and techniques to increase the overall efficiency of the DC-DC converter through use of a highly reliable and accurate and relatively low power zero-crossing detector (ZCD) configured to help control the timing of the various modes, cycles, and switching in the DC-DC converter, as described herein.

FIG. 1 is a block diagram of a DC-DC converter 100, according to an embodiment of the present disclosure. In FIG. 1, DC-DC converter 100 includes a power stage 110, a controller 120, and an output load sensor 130. Power stage 110 may be configured to receive an input voltage (e.g., 5 VDC) and convert it to a different voltage (e.g., 1.5 VDC) provided as the output voltage from DC-DC converter 100. Power stage 110 may be implemented as a boost converter, a buck converter, a boost-buck converter, a synchronous or asynchronous discontinuous conduction mode (DCM) DC-DC converter, and/or other types of DC-DC converters, for example, and/or other types of power converters, as described herein. Output load sensor 130 may be configured to determine a load status of DC-DC converter 100 and provide the load status and/or related information to controller 120, which may be configured to generate feedback as various control signals provided to power stage 110 to regulate the power conversion, as described herein. Each of power stage 110, controller 120, and output load sensor 130 may be implemented by one or more logic devices (e.g., microcontrollers, field programmable gate arrays, and/or other logic devices), analog or digital circuit elements, and/or other circuitry, for example, and may be coupled together and/or configured to implement any of a variety of power converters, including any of the power converters described herein.

Figure 2:
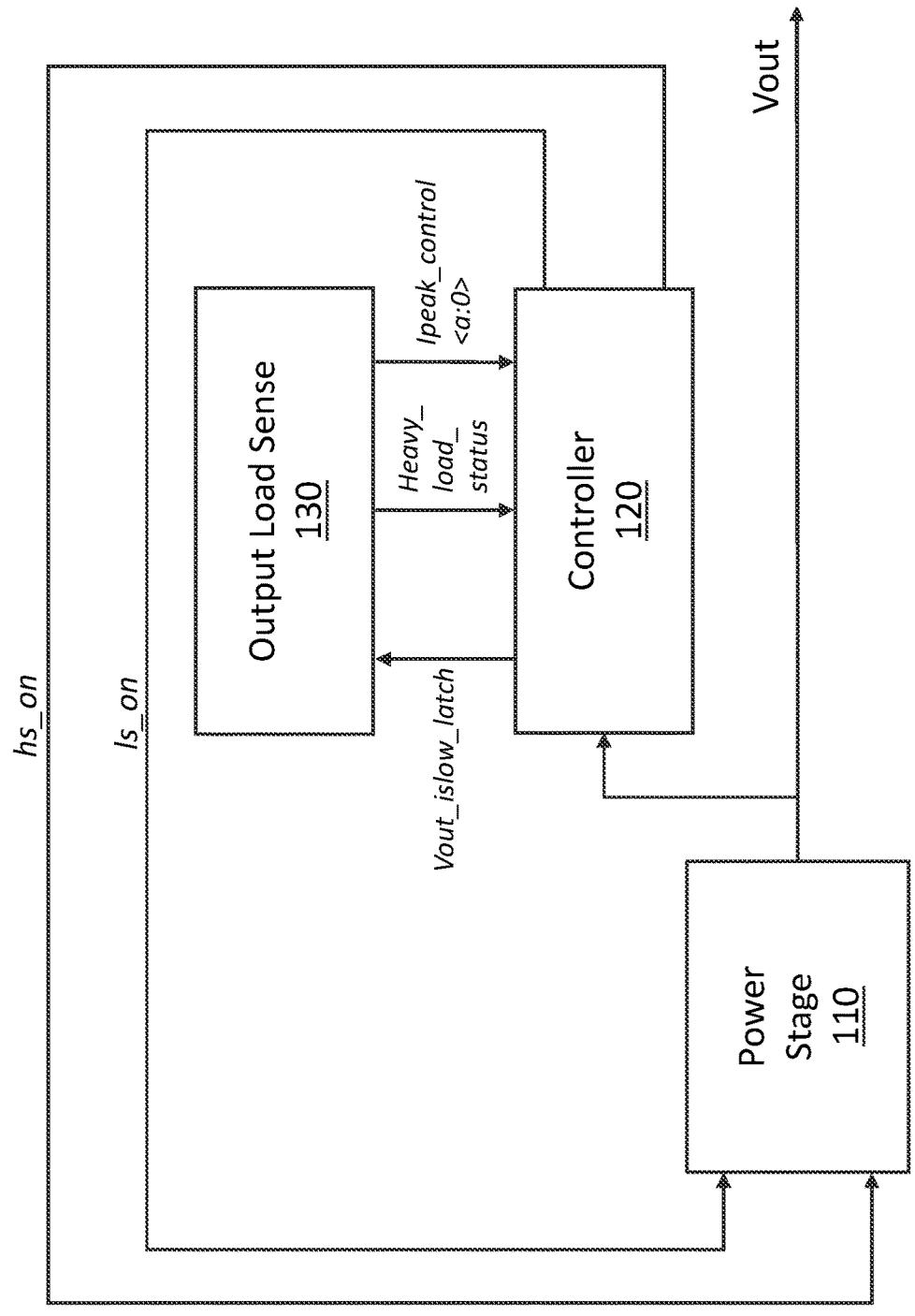
FIG. 2 is a block diagram of a DC-DC converter illustrating interconnections between the various modules, in accordance with an embodiment of the present disclosure.

Operation of DC-DC converter 100 of FIG. 1 is described in further detail with respect to the block diagram of FIG. 2, which illustrates supplemental and/or alternative interconnections between the various elements of DC-DC converter 100, according to an embodiment of the present disclosure. For example, output load sensor 130 may be configured to determine an output load status of DC-DC converter 100 and/or power stage 110 and provide a corresponding output load status value to controller 120 via one or more load status signals, such as Heavy_load_status and/or logic signal Ipeak_control<a:0>, and controller 120 may be configured to control power stage 110 based on such load status signals, such as in the form of one or more control signals provided to power stage 110 (e.g., logic/control signals hs_on or ls_on configured to enable/disable respective high-side and low-side FETs of power stage 110, as described herein). Power stage 110 may be configured to receive and use such control signals to provide and/or adjust a peak current of the power stage 110, thus regulating the power conversion of DC-DC converter 100.

Figure 3:
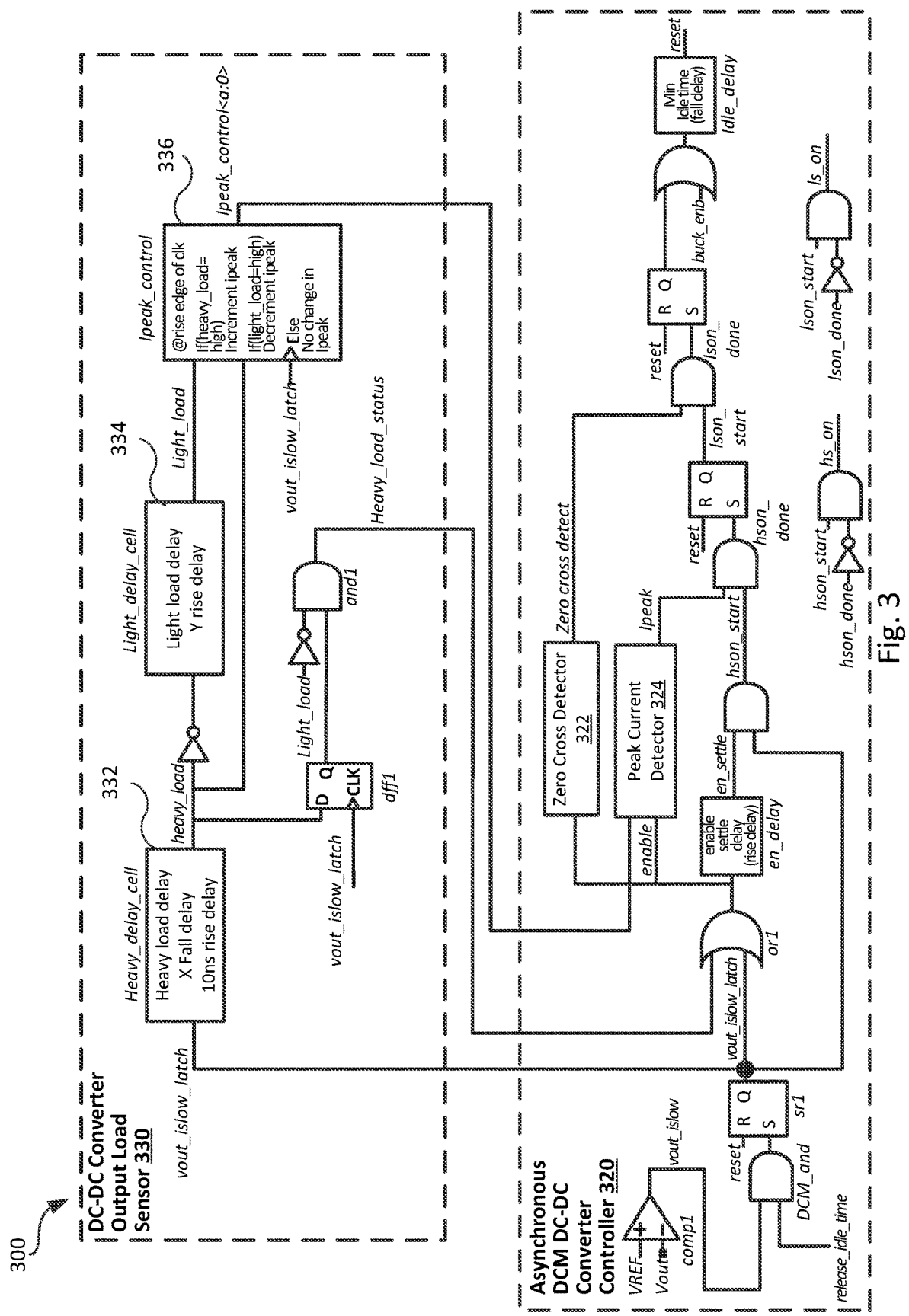
FIG. 3 is a circuit diagram of a load sensing circuit and controller circuit of a DC-DC converter, in accordance with an embodiment of the present disclosure.

FIG. 3 illustrates a circuit diagram of an output load sensor 330 and a controller 320 of a DC-DC converter 300, according to an embodiment of the present disclosure. Output load sensor 330 and controller 320 may be configured to monitor an output load status of DC-DC converter 300 (e.g., a DC-DC buck converter) using consecutive timers of output load sensor 330. Controller 320 (e.g., an asynchronous DCM DC-DC converter controller) may be configured to use the output load status to perform adaptive peak current control such that DC-DC converter 300 is able to provide a higher output load capacity under heavy output load conditions, provide a smaller output voltage ripple under light output load conditions, and regulate a switching frequency of DC-DC converter 300 between audio frequency and radio frequency across different output loads to reduce switch noise interference. In addition, controller 320 may be configured to adaptively change a power mode of DC-DC converter 300 to a power save mode under relatively light output load status conditions (e.g., to disable zero-crossing detector 322 and peak current detector 324 and reduce quiescent current intrinsic to operation of detectors 322, 324) and to a power burst mode under relatively heavy output load status to support a higher output load capacity (e.g., to force enable zero-crossing detector 322 and peak current detector 324 and increase the cycle speed of DC-DC converter 300).

Adaptive peak current control, as described herein, can provide a higher output load capacity by incrementing the peak current, can provide a lower output voltage ripple by decrementing the peak current, and can control the switching frequency of DC-DC converter 300 by changing the peak current. For example, in audio and wireless applications, changing the switching frequency of DC-DC converter 300 between audio frequency and radio frequency can be desirable to reduce switch noise interference coupling into the operational frequencies of the audio or wireless device. While pulse density modulation techniques can be used for peak current control, pulse density modulation uses a relatively high frequency oscillator (e.g., oscillator frequency≥maximum DC-DC switching frequency), which can be difficult to implement in relatively low power asynchronous DC-DC converters. Thus, embodiments of the present disclosure present techniques that perform adaptive peak current control with two consecutive timers and asynchronous DC-DC converter control configured for low quiescent current DC-DC converter applications, as described herein. In some embodiments, more than two timers may be used, for example, such as three or more timers to provide more granular adaptive control of the peak current.

In some embodiments, such as in an asynchronous DCM DC-DC converter, peak current detector 324 and zero-crossing detector 322 can consume the most quiescent current within controller 320 when enabled, and so controller 320 may be configured to disable such detectors during light output load conditions (e.g., a power save mode), such as where their quiescent current is comparable to the light output load current. However, when the detectors are disabled, controller 320 must generally wait until the detectors are reenabled before proceeding with the next switching cycle, and the concomitant enable settle delay may degrade the maximum achievable output load capability by limiting the highest achievable switching frequency. By contrast, under relatively heavy output load conditions, the detectors' quiescent current is typically negligible compared to the output load current, and therefore peak current detector 324 and zero-crossing detector 322 may be kept enabled to support the higher output load capability without significantly degrading converter efficiency (e.g., a power burst mode). Accordingly, the described embodiments provide adaptive power mode control in asynchronous DCM DC-DC converters by using consecutive timers (e.g., Heavy_delay_cell 332 and Light_delay_cell 334) in an adaptive peak current control methodology.

As illustrated in FIG. 3, asynchronous DCM DC-DC converter controller 320 may be configured to initiate a switching cycle (e.g., where one cycle proceeds: hs_on=high, ls_on=low; hs_on=low, ls_on=high; hs_on=low, ls_on=low-idle mode) when output comparator (comp1) senses that output voltage (Vout) generated by power stage 110 is lower than a threshold voltage (e.g., VREF, the desired output voltage of DC-DC converter 300) and output comparator (comp1) trips vout_islow signal to logic high. The vout_islow signal is provided to reset-dominant SR latch (sr1) (e.g., via AND gate DCM_and, which gates vout_islow with an idle release signal release_idle_time configured to indicate DC-DC converter 300 is ready to exit an idle mode and begin a next switching cycle while maintaining DCM operation, as described herein), which latches the vout_islow_latch signal. When vout_islow_latch signal is logic high, an enable signal provided to each detector block (i.e., zero-crossing detector 322 and peak current detector 324) also trips high when in a light output load condition (e.g., when heavy_load_status=low).

When the enable signal trips high, controller 320 waits for the enable settle delay (en_delay) to ensure that detectors 322, 324 are awake before turning on a high-side field effect transistor (FET) of power stage 110 (hs_on=high). When the high-side FET turns on, the output current in an output inductor of power stage 110 rises and is monitored by peak current detector 324. When peak current detector 324 senses that the inductor current is higher than a value set by ipeak_control<a:0>, signal Ipeak trips high, which then turns off the high-side FET and turns on a low-side FET of power stage 110 (hs_on=low, ls_on=high), thereby causing the inductor current to decrease. When the inductor current is close to zero, zero-crossing detector 322 trips high and turns off the low-side FET (ls_on=low) and enters an idle mode (both the high-side FET and the low-side FET are off). After minimum idle delay (idle_delay), the DC-DC converter 300 is ready for the next switching cycle once Vout drops below VREF again.

In FIG. 3, output load sensor 330 includes two consecutive timers (heavy_delay_cell 332 and light_delay_cell 334) and a peak current controller 336 (Ipeak_control). In some embodiments, peak current controller 336 (Ipeak_control) may be implemented as a 4-bit digital logic device/controller that is configured to output varying levels of peak current target values at 16 different increments. In other embodiments, peak current controller 336 (Ipeak_control) may be implemented as a 3-bit or a 5-bit controller, for example, or a different bit width controller, to provide a wider or narrower dynamic range and/or peak current resolution, for example. At the end of a switching cycle, when DC-DC converter 300 enters idle mode, the vout_islow_latch signal trips to a logic low due to reset-dominant SR latch (sr1) reset=high, and heavy_delay_cell starts the X fall delay. During the X fall delay, the heavy_load signal stays high (indicating a 'heavy' load status), and after X delay, heavy_load trips to a logic low.

When heavy_load trips low, light_delay_cell starts the Y rise delay. During the Y rise delay, both heavy_load and light_load signals are low (indicating load between heavy load and light load status, referred to herein as 'good' or 'median' load status). After Y rise delay, the light_load signal trips to a logic high (indicating 'light' load status). The light_load and heavy_load signals are sampled by peak current controller 336 (Ipeak_control) and D-flip-flop (dff1), respectfully, using the rising edge of the vout_islow_latch signal. If heavy_load=high and light_load=low when they are sampled, the load status for DC-DC converter 300 is a 'heavy' load status, and the time between switching cycles is less than the X delay (e.g., as set by detectors 322, 324). If heavy_load=low and light_load=low when they are sampled, the load status for DC-DC converter 300 is a 'good' load status, and the time between switching cycles is between X and X+Y, inclusive. If heavy_load=low and light_load=high when they are sampled, the load status for DC-DC converter 300 is a 'light' load status, and the time between switching cycles is longer than X+Y.

In various embodiments, peak current controller 336 (Ipeak_control) may be configured to increase the peak current in a heavy load status by incrementing Ipeak_control<a:0>, to decrease the peak current in a light load status by decrementing Ipeak_control<a:0>, and to keep the same peak current in a good load status, based on the sampled heavy_load and light load signals, as shown. In some embodiments, dff1 samples the heavy_load signal to enable a power-burst mode (heavy_load_status=high). If heavy_load_status=high, the enable and en_settle signals are kept at a logic high for the next switching cycle by OR gate (or 1). Power burst mode (heavy_load_status=high) bypasses the enable settle delay (en_delay) by maintaining a logic high signal at the input of (en_delay) and turns on the high-side FET as soon as the minimum idle time (idle_delay) expires.

In various embodiments, heavy_delay_cell 332 may be implemented with an additional 10 ns rise time added to reduce or avoid a false heavy_load=high sample. For example, when the vout_islow_latch signal trips to a logic high, the heavy_load signal would trip to a logic high after 10 ns. Thus, if the heavy_load signal is logic low at the rising edge of the vout_islow_latch signal, heavy_load=low is sampled. Also, this 10 ns rise delay keeps the light_load signal high to sample light_load=high. Thus, if light_load signal is high at the rising edge of vout_islow_latch signal, light_load=high is sampled. A 10 ns delay and/or other shorter or longer delays may be selected to avoid false heavy_load=high and to sample light_load=high properly. Thus, in some embodiments, the 10 ns delay may be a longer or shorter delay. In some embodiments, heavy_delay_cell 332 and light_delay_cell 334 can be implemented using resistor-capacitor delays or bias current-capacitor delays to draw essentially zero quiescent current. More generally, heavy_delay_cell 332 and light_delay_cell 334 can be implemented using any combination of digital and/or analog circuitry configured to provide the heavy_load and light_load signals as described herein.

Figure 4:
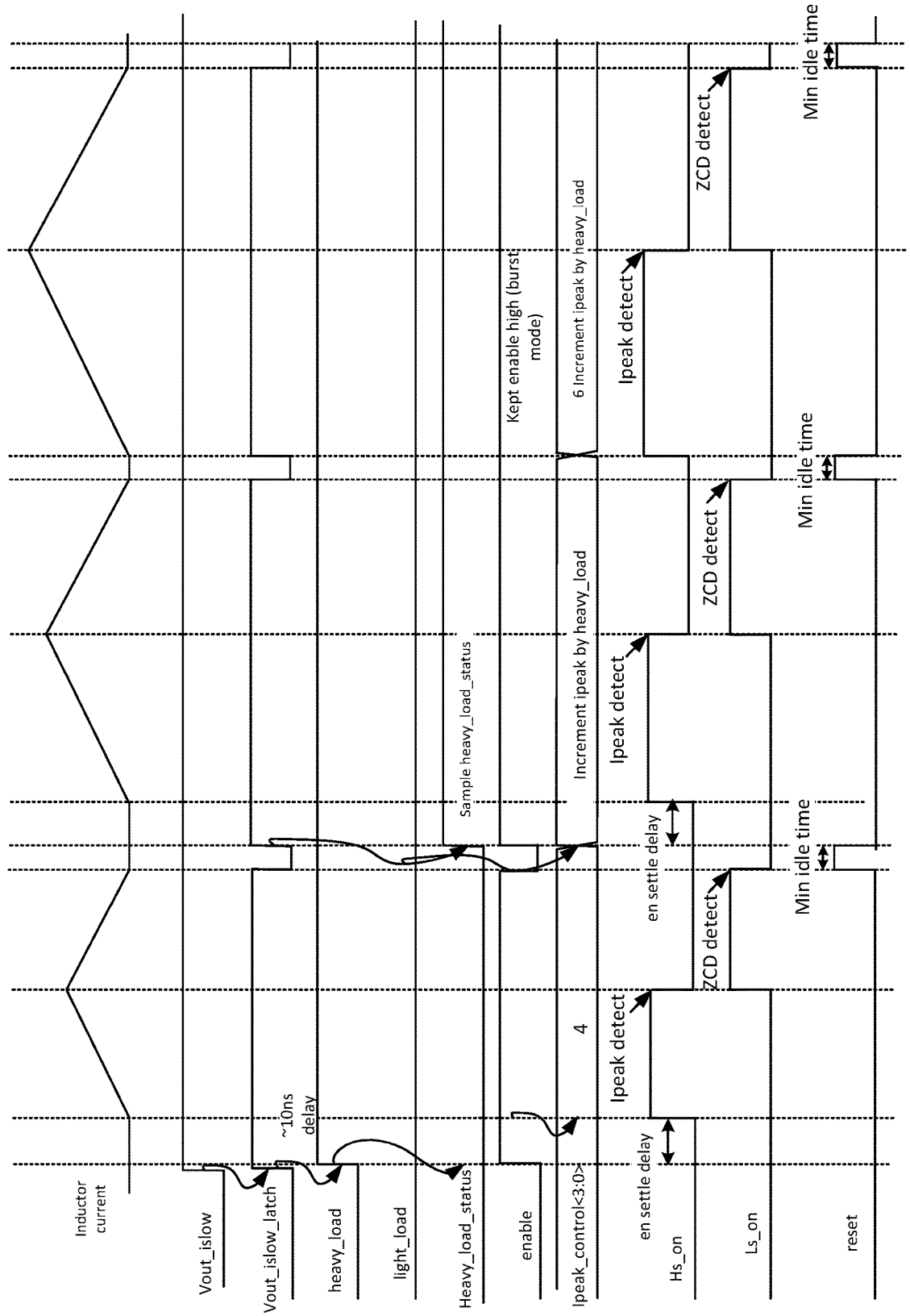
FIG. 4 is a timing diagram illustrating various waveforms representing DC-DC converter transitions from a good load status to a heavy load status, in accordance with an embodiment of the present disclosure.

FIG. 4 is a timing diagram illustrating various waveforms when the DC-DC converter transitions from a good load status to a heavy load status, according to an embodiment of the present disclosure. As illustrated, both heavy_load and light_load are initially low when vout_islow_latch trips high, which indicates that the previous switching cycle was a good load status. Because heavy_load=low and light_load=low are sampled according to the vout_islow_latch signal, ipeak_control<x:0> keeps the same peak current target value, and heavy_load_status signal is low (e.g., power save mode). At the end of the first switching cycle, when zero-crossing detect trips high, the reset signal stays high for the minimum idle time and trips the vout_islow_latch signal low. When the vout_islow_latch signal trips low, heavy_delay_cell 332 starts the X fall delay. Before the X fall delay passes, a second switching cycle starts with the vout_islow being high. Thus, when vout_islow_latch signal trips high, it samples heavy_load=high and light_load=low, which indicates a heavy_load_status. Accordingly, peak current controller 336 increments peak current target value Ipeak_control<a:0> from 4 to 5, for example, to support a higher load capacity, and ddf1 samples heavy_load and sets heavy_load_status=high to enable power burst mode.

Because the first switching cycle was a 'good' load status, all detectors 322, 324 were initially disabled to reduce quiescent current draw. When vout_islow_latch signal trips high for the second switching cycle, it enables 322, 324 and waits for enable settle delay (en_delay) before turning on a high-side FET of power stage 110. At the end of the second switching cycle, the X fall delay starts, and before the X fall delay expires, the third switching cycles starts with the vout_islow_latch signal tripping high. heavy_load=high and light_load=low are sampled (e.g., a 'heavy' load status) and therefore the peak current control block increments ipeak_control<a:0> from 5 to 6, for example, to support an even higher load capacity. Because the previous switching cycle (2$^{nd}$ cycle) was a heavy load (heavy_load_status=high), detectors 322, 324 were kept enabled, and therefore the DC-DC asynchronous controller 320 bypasses the enable settle delay (en_delay) and immediately starts the high-side FET turn on (e.g., a power burst mode). By incrementing peak current target value Ipeak_control<a:0> and bypassing enable settle time, DC-DC converter 300 is able to increase the maximum output load capacity.

Figure 5:
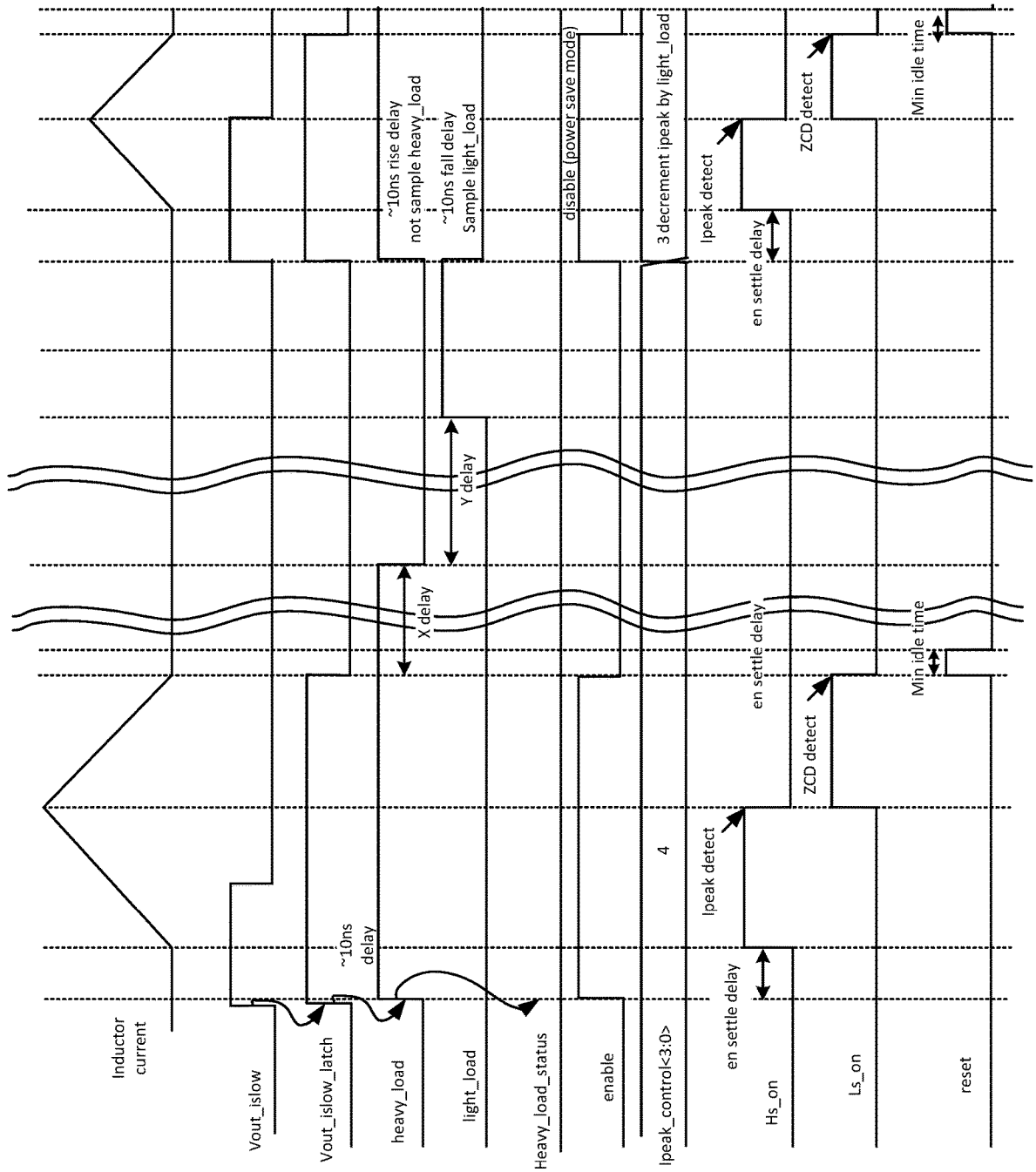
FIG. 5 is a timing diagram illustrating various waveforms representing DC-DC converter transitions from a good load status to a light load status, in accordance with an embodiment of the present disclosure.

FIG. 5 is a timing diagram illustrating various waveforms when DC-DC converter 300 transitions from a good load status to a light load status, according to an embodiment of the present disclosure. As illustrated, DC-DC converter 300 starts with a 'good' load status (e.g., sampled heavy_load=low and light_load=low). At the end of first switching cycle, zero-crossing detect trips high, and vout_islow_latch signal goes low by the reset signal.

In light load conditions, Vout stays higher than VREF for a longer period of time, and therefore vout_islow and vout_islow_latch stay low for a longer time than the X+Y delay. After the X delay, heavy_load trips low due to the X fall delay of heavy_delay_cell 332, and the Y rise delay of light_delay_cell 334 starts. After the Y delay, light_load trips high (light load status), and when vout_islow_latch signal trips high, light_load=high is sampled. Finally, Ipeak_control<a:0> is decremented to generate a lower output voltage ripple and higher switching frequency. heavy_load_status also trips low for the power-save mode.

Figure 6:
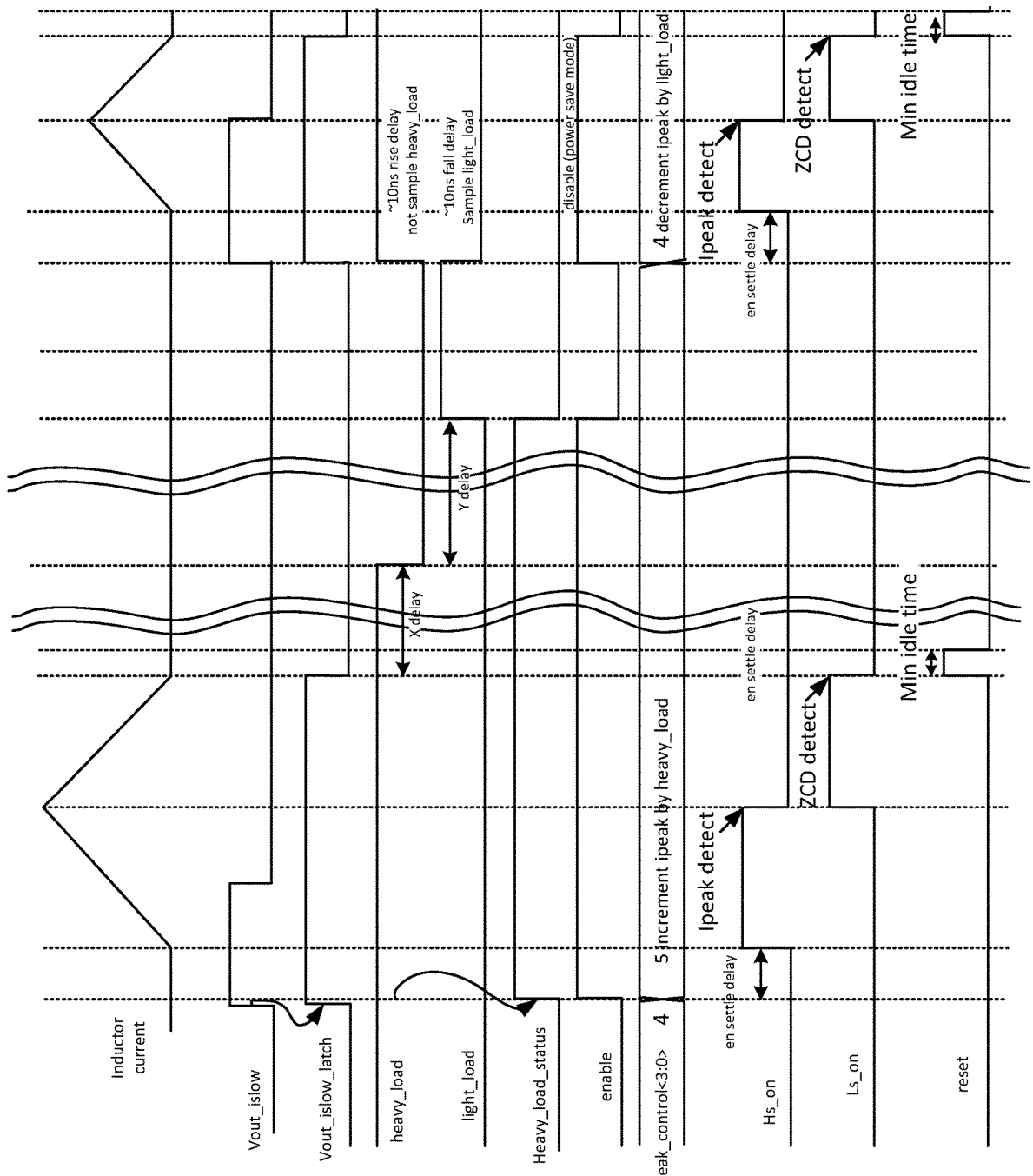
FIG. 6 is a timing diagram illustrating various waveforms representing DC-DC converter transitions from a heavy load status to a light load status, in accordance with an embodiment of the present disclosure.

FIG. 6 is a timing diagram illustrating various waveforms when the DC-DC converter transitions from a heavy_load_status to a light load status, according to an embodiment of the present disclosure. As illustrated, heavy_load is initially high, so when vout_islow trips, heavy_load=high is sampled and sets heavy_load_status=high. heavy_load_status=high keeps the enable signal high for detectors 322, 324, but after X+Y delay from end of first switching cycle, light_load trips high. The inverted light_load signal gates heavy_load_status low via AND gate (and 1), so when light_load trips high, the enable signal goes low to disable detectors 322, 324 and enter a power save mode, as described herein.

Figure 7:
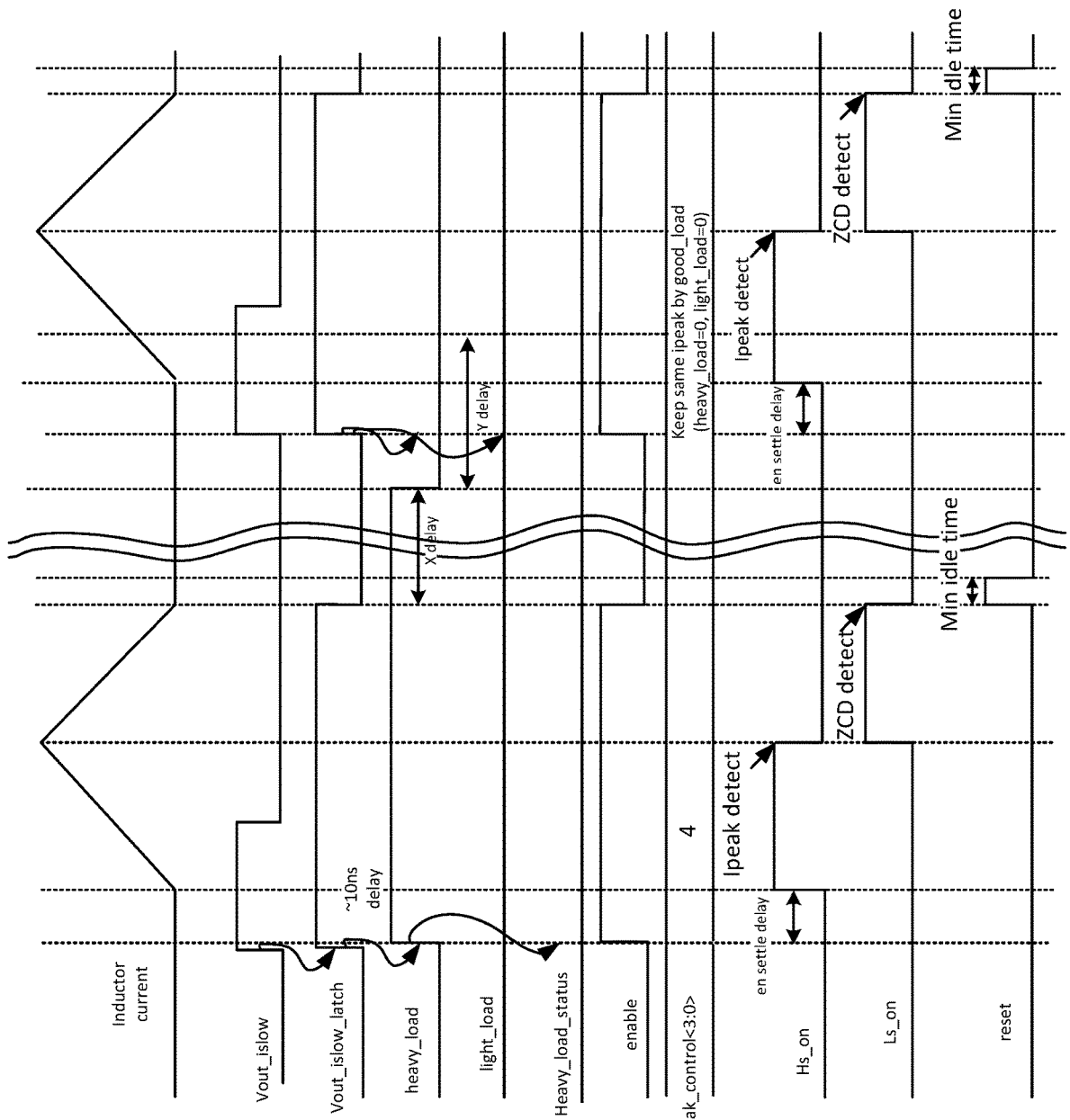
FIG. 7 is a timing diagram illustrating various waveforms representing DC-DC converter transitions from a good load status to a good load status, in accordance with an embodiment of the present disclosure.

FIG. 7 is a timing diagram illustrating various waveforms when the DC-DC converter load is in a steady-state, according to an embodiment of the present disclosure. In steady-state, the switching frequency is already in good load status and remains in the good load status. For example, FIGS. 4-6 illustrate transition scenarios when a load changes abruptly, for example, from a heavy load to light load to a median load, or any combination of those, thus in those scenarios, the peak current is adaptively adjusted by peak current controller 336 towards a good load status for its new output load value. In this manner, after the abrupt load change, the output load becomes steady-state and the adaptive peak current loop is completed, and DC-DC converter 300 converges into a good load status regardless of the updated output load value. Thus, as illustrated in FIG. 7, DC-DC converter 300 remains in the good load status (e.g., sampled heavy_load=low and light_load=low) when the load is not changing. Because all switching cycles start during the Y delay, the converted good load status brings the switching period to between X and X+Y when the output load is steady state.

Figure 8:
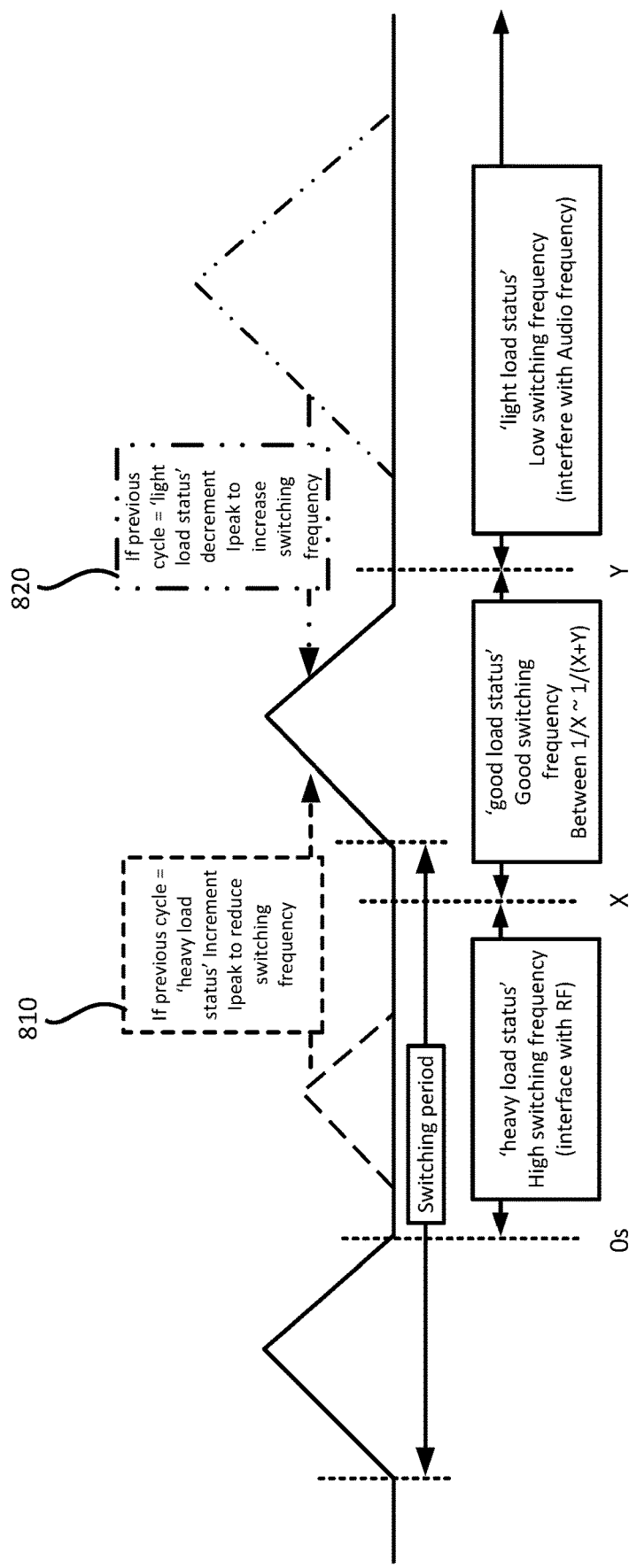
FIG. 8 illustrates waveforms of an adaptive peak current control for switching frequency regulation, in accordance with an embodiment of the present disclosure.

FIG. 8 illustrates waveforms of an adaptive peak current control for switching frequency regulation, according to an embodiment of the present disclosure. For example, the adaptive peak current control regulates the switching frequency between audio frequency and radio frequency. If the switching frequency is too high and it interferes with a radio frequency (block 810), the peak current may be incremented to push the next cycle to a lower switching frequency, thereby bringing the peak current in to the preferred switching frequency range. If the switching frequency is too low (block 820) and it interferes with an audio frequency, the peak current may be decremented to push the next pulse to a higher switching frequency, thereby bringing the peak current in to the preferred switching frequency range. With a steady-state output load, the switching frequency may be regulated between 1/X and 1/(X+Y) as shown. Thus, by setting the X delay greater than the radio frequency period (e.g., greater than 415 ns for 2.4 MHz Bluetooth applications) and setting the X+Y delay less than the audio frequency period (e.g., less than 25 us for 40 kHz max audio frequency), the asynchronous DCM DC-DC converter (e.g., DC-DC converter 300) can reduce interference to audio frequency and radio frequency by pushing and then maintaining the peak current in the preferred switching frequency range. In some embodiments, a further Z delay (or additional delays) may be added to further tune and regulate the peak current.

In some embodiments, the described techniques may also be implemented for a synchronous DC-DC converter. However, synchronous DC-DC converters may consume more quiescent current for an oscillator. In further embodiments, more than two timers may be implemented to check more than three output load statuses. For example, four consecutive timers can check five output load statuses, for example: 1) 'very heavy_load_status' that increments the peak current target value by 2 LSB; 2) 'heavy_load_status' that increments the peak current target value by one LSB; 3) 'good load status' that keep the same peak current target value; 4) 'light load status' that decrements the peak current target value by 1 LSB; and 5) 'very light load status' that decrements the peak current target value by two LSB. Then, the switching frequency may converge to a good switching frequency much faster.

As noted above, embodiments described herein may incorporate a relatively power efficient zero-crossing detector (ZCD) design that uses an integrator circuit to imitate a DCM DC-DC converter output inductor current profile to trigger a low-side FET on-time that crosses a zero-output current in an output inductor of power stage 110. Embodiments are robust to power ground noise, and intrinsic ZCD timing errors may be calibrated and compensated for using an inductor current direction detector and a calibration controller (e.g., implementing a calibration process) to achieve a relatively high and/or optimum DC-DC converter efficiency, as described herein.

Prior ZCD designs sense when a switch voltage is equal to a power ground voltage (pvss) to detect the zero-crossing point of the output current in an output inductor of a power stage for a DC-DC converter, which is susceptible to ground noise. Large pvss voltage spikes are expected due to a sharp current transition from the abrupt high-side FET on (hs_on) to low-side FET on (ls_on) transition and a parasitic inductance at pvss. Thus, prior methodologies may generate false ZCD trips, which can lead to functionality issues (overheating, drooping Vout, low efficiency operation, buck failure, and/or damage to the DC-DC converter. In embodiments described herein, a ZCD includes a ZCD integrator configured to charge/discharge an integrator capacitor (Cint) according to the difference between a switch voltage VSW fed through an input resistor (Rint) and an output voltage Vout (e.g., a (VSW-Vout)/Rint) current) during hs_on and ls_on to detect the zero-crossing point, and the ZCD integrator is robust to pvss noise.

In addition, prior methods require sensing a relatively small voltage change (e.g., near pvss), roughly proportional to the low-side FET Ron*inductor current, and so such prior methods require an ultra-low offset comparator. Such comparator is often implemented with offset cancellation techniques, which are typically susceptible to noise during the offset sample phase. By contrast, embodiments of the ZCD described herein sense a voltage change at a relatively large voltage level (e.g., the ZCD integrator output voltage), so embodiments do not require a high-performance comparator.

Moreover, prior ZCD designs suffer from errors due to offset and delay. Embodiments of the ZCD described herein implement an auto ZCD error calibration technique using an inductor current direction detector and a calibration controller to compensate for ZCD errors caused by non-ideality. The calibration controller automatically calibrates the ZCD error to the minimum achievable ZCD error for optimum efficiency, in that preemptory or delayed zero-crossing detection can significantly reduce the efficiency of the DC-DC converter.

Figure 9:
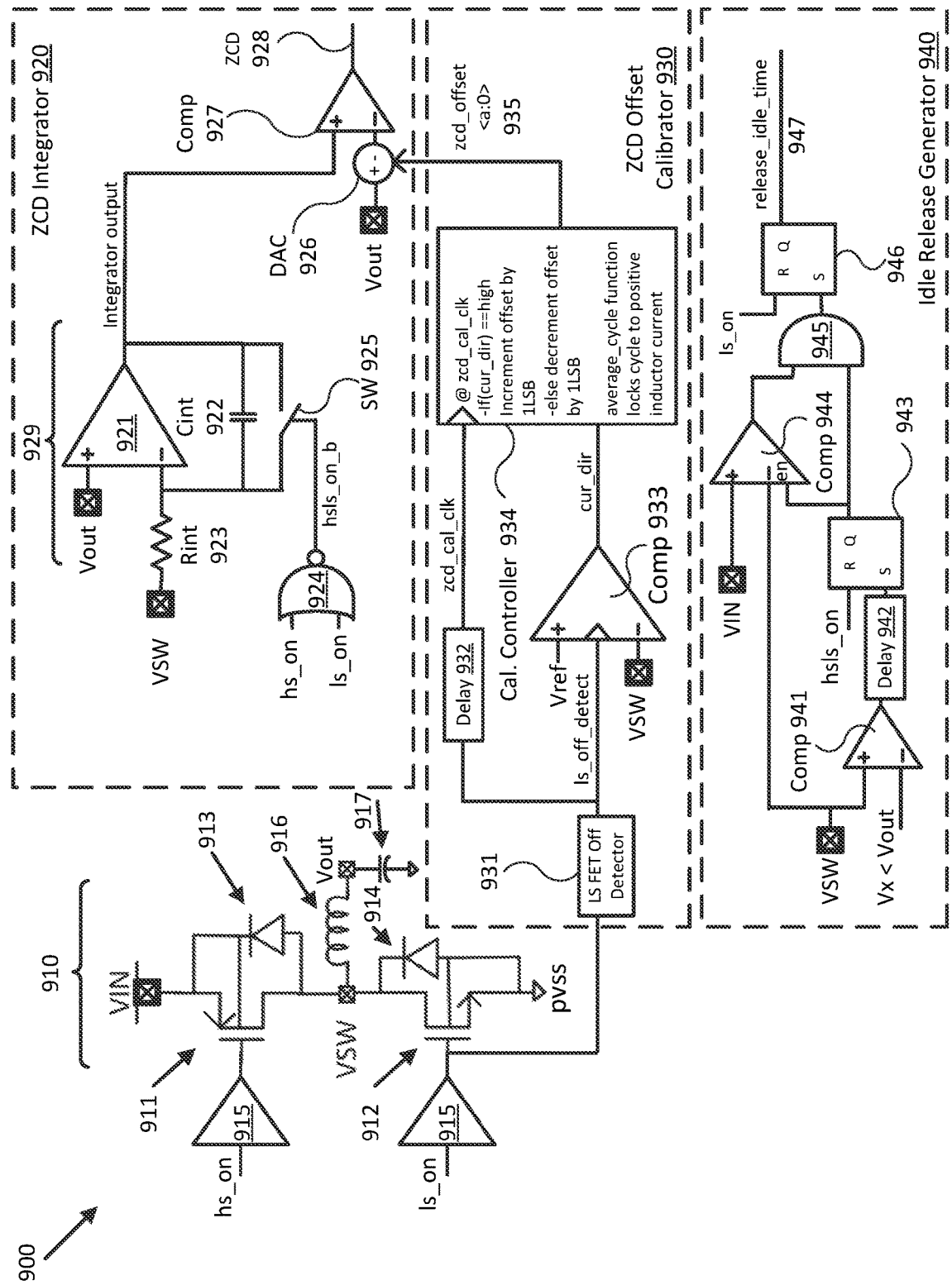
FIG. 9 is a circuit diagram of a zero-crossing detector (ZCD) for a DC-DC converter, in accordance with an embodiment of the present disclosure.

FIG. 9 is a circuit diagram of a ZCD 900 for a DC-DC converter (e.g., DC-DC converter 100, 200, and/or 300), in accordance with an embodiment of the present disclosure. For example, in the embodiment shown in FIG. 9, ZCD 900 includes ZCD integrator 920, ZCD offset calibrator 930, and idle release generator 940 configured to receive/monitor switch voltage VSW and output voltage Vout of power stage 910, along with and various switch control signals (e.g., high-side on signal hs_on and low-side on signal ls_on) generated by controller 120/320, and generate zero cross detect signal 928 based, at least in part, on such monitored voltages and switch control signals, as described herein. In various embodiments, ZCD 900 (e.g., ZCD integrator 920, ZCD offset calibrator 930, and/or idle release generator 940) may be integrated with a DC-DC converter controller, such as ZCD 322 integrated within DC-DC converter controller 320 of DC-DC converter 300.

As shown in FIG. 9, power stage 910 may be implemented as a buck DC-DC converter including a high-side FET/switch 911 coupled between input voltage Vin of DC-DC converter 100, 200, and/or 300 and a switch voltage VSW at an input of an output inductor 916 of power stage 910, for example, and a low-side FET/switch 912 coupled between switch voltage VSW at the input of output inductor 916 and a power ground (pvss) for DC-DC converter 100, 200, and/or 300. In general, switch voltage VSW may be measured between the input side of output inductor 916 and power ground (pvss) for DC-DC converter 300, for example, and/or at the input side of output inductor 916 (e.g., relative to an absolute ground reference for DC-DC converter 300), and switches 911/912 may be controlled by respective high-side control signal hs_on and low-side control signal ls_on (e.g., gate control signals generated and/or provided by controller 320 of DC-DC converter 300). High-side FET 911 and low-side FET 912 may each include respective effective body diode structures 913 and 914 providing conductive paths for currents flowing through output inductor 916 when switches 911/912 are closed, such as when high-side control signal hs_on and low-side control signal ls_on are logic low. In various embodiments, each control signal may be buffered by a buffer 915 prior to reaching switches 911/912, as shown. An output side of output inductor 916 may be coupled to ground via a shunt capacitor 917 (e.g., to shunt relatively high frequency noise to ground and help isolate switch noise generated by DC-DC converter 300 from an electronic device or devices powered by DC-DC converter 300.

ZCD integrator 920 may be configured to receive switch voltage VSW and output voltage Vout of power stage 910 and to generate zero-crossing detect signal 928 based, at least in part, on the received switch voltage VSW and output voltage Vout. In various embodiments, zero-crossing detect signal 928 may be configured to indicate an output current in output inductor 916 of power stage 910 (e.g., of DC-DC converter 300) is approximately zero and/or is crossing zero. As shown in FIG. 9, ZCD integrator 920 may include a differential voltage integrator 929 configured to receive switch voltage VSW (e.g., through input resistor 923 (Rint)) and output voltage Vout and generate an integrator output that is then provided to output comparator 927. Output comparator 927 of ZCD integrator 920 may be configured to receive the integrator output generated by differential voltage integrator 929 and to generate the zero-crossing signal based, at least in part, on the integrator output and output voltage Vout, as shown.

In some embodiments, ZCD integrator 920 may include an integrator reset switch 925 configured to reset differential voltage integrator 929 during an idle mode of DC-DC converter 300 (e.g., both the high-side FET 911 and low-side FET 912 are off; hs_on=low, ls_on=low). For example, as shown in FIG. 9, when hs_on=low and ls_on=low, hsls_on_b generated by NOR gate 924 is high, which closes integrator reset switch 925 and completely discharges integrator capacitor 922 (Cint). ZCD integrator 920 may also include a ZCD offset calibration applicator 926 configured to receive output voltage Vout and a ZCD calibration offset 935 (e.g., a digital offset zcd_offset<a:0> or an analog offset, such as a programmable voltage) and provide a corresponding calibrated output voltage to output comparator 927, where the calibrated output voltage is configured to compensate for operational non-idealities associated with operation of DC-DC converter 300, as described herein. In some embodiments, ZCD offset calibration applicator 926 may be implemented as a programmable voltage generator (e.g., a digital to analog converter) configured to receive ZCD calibration offset 935, combine it with output voltage Vout, and provide the combination as the calibrated output voltage to output comparator 927, which is configured to generate zero-crossing detect signal 928 (e.g., zero cross detect in FIG. 3) when the integrator output crosses the calibrated output voltage.

ZCD offset calibrator 930 may be configured to receive switch voltage VSW and generate ZCD calibration offset 935 based, at least in part, on the received switch voltage VSW, where ZCD integrator 920 is configured to generate zero-crossing detect signal 928 based, at least in part, on ZCD calibration offset 935, such as applying it to output voltage Vout using ZCD offset calibration applicator 926 as shown. In some embodiments, ZCD offset calibrator 930 includes a current direction detector 933 configured to receive switch voltage VSW, compare switch voltage VSW to a reference voltage Vref for DC-DC converter 3 (e.g., Vref is approximately equal to the desired output voltage of power stage 910 and/or DC-DC converter 300) approximately when low-side switch 912 of power stage 910 transitions to an off state (e.g. ls_on transitions from high to low), and generate a current direction signal curr_dir based, at least in part, on the comparison of switch voltage VSW and reference voltage Vref. ZCD offset calibrator 930 may also include a logic device/calibration controller 934 configured to receive current direction signal cur_dir and generate ZCD calibration offset 935 based, at least in part, on current direction signal cur_dir, where ZCD calibration offset 935 is configured to adjust a timing of zero-crossing detect signal 928 (e.g., by adjusting the comparison voltage supplied to output comparator 927) in order to compensate for operational non-idealities associated with operation of DC-DC converter 300.

In some embodiments, ZCD offset calibrator 930 may include low-side FET off detector 931 configured to monitor low-side control signal ls_on and/or the gate voltage of low-side FET 912 and generate a low-side off detect signal ls_off_detect, which may be used to trigger operation of current direction detector 933 and calibration controller 934 (e.g., delayed by delay 932 sufficiently to ensure operation of current direction detector 933 is completed before calibration controller 934 operates to generate ZCD calibration offset 935 based, at least in part, on current direction signal cur_dir. In various embodiments, calibration controller 934 may be configured to increment ZCD calibration offset 935 by a least significant bit (1LSB) when switch voltage VSW is less than reference voltage Vref (e.g., current direction is negative), or to decrement ZCD calibration offset 935 by a least significant bit (1LSB) when switch voltage VSW is greater than or equal to reference voltage Vref (e.g., current direction is not negative), for each switching cycle of DC-DC converter 300. In alternative or supplemental embodiments, calibration controller 934 may be configured to implement a state machine, such as state machine 1000 of FIG. 10, configured to average current direction signal cur_dir and/or lock ZCD calibration offset 935 for a predetermined number of switching cycles of DC-DC converter 300 to provide a more stable ZCD calibration offset 935.

In still further embodiments, calibration controller 934 may be configured to iteratively increment and/or decrement ZCD calibration offset 935 based, at least in part, on the current direction of the output current in the output inductor determined approximately when low-side switch 912 of power stage 910 transitions to an off state (e.g., as represented by current direction signal cur_dir), to determine a negative to positive transition of the current direction after incrementing ZCD calibration offset 935, and to lock ZCD calibration offset 935 for a predetermined number of switching cycles of power stage 910 of DC-DC converter 300.

Idle release generator 940 may be configured to receive switch voltage VSW and input voltage VIN for power stage 910 of DC-DC converter 300 and generate an idle release signal 947 (release_idle_time) based, at least in part, on the received switch voltage VSW and input voltage VIN, where idle release signal 947 is configured to indicate DC-DC converter 300 is ready to exit an idle mode of DC-DC converter 300. In particular, DC-DC converter 300 may be ready to exit such idle mode, while operating as a DCM DC-DC converter, when any output current remaining in output inductor 916 after DC-DC converter has entered the idle mode has discharged through one or both of body diodes 913/914. In some embodiments, idle release generator 940 may include a first low-side comparator 941 configured receive switch voltage VSW and generate a first comparator output indicating switch voltage VSW is greater than an idle mode threshold voltage Vx preselected to be between ground (pvss) and output voltage Vout. In such embodiments, idle release generator 940 may also include a second high-side comparator 944 coupled to the comparator output and configured to generate a second comparator output indicating switch voltage VSW is less than input voltage VIN, after low-side comparator 941 generates the first comparator output. Idle release generator 940 may include a logic device (e.g., AND gate 945) configured to generate idle release signal 947 based, at least in part, on the first and second comparator outputs, as shown.

Idle release generator 940 may additionally include various other circuit elements to facilitate operation of idle release generator 940, such as delay 942 (e.g., approximately 10-50 ns, typically ~20 ns) to allow switch voltage VSW to settle and to preclude any transients propagating through idle release generator 940 before high-side comparator 944 is triggered, latch 943 configured to latch the first comparator output (e.g., when both switch control signals transition high or low), and latch 946 configured to latch the second comparator output (e.g., when ls_on transitions to high or low). In general, idle release signal 947 may be provided to controller 320 to maintain the idle time (e.g., potentially extend Idle_delay) until the output current has discharged through body diodes 913/914.

In a DCM DC-DC converter, such as one implemented with power stage 910, during its idle mode, both high-side FET 911 and low-side FET 912 are off (hs_on=low, ls_on=low), so hsls_on_b is high, which shorts integrator capacitor 922 (Cint) with integrator reset switch 925. Thus, ZCD integrator 920 acts as a unity gain buffer and sets the initial integrator output voltage to Vout voltage since switch voltage VSW~=Vout during idle mode when the inductor current is fully discharged to 0 A in the idle mode steady state, which may be guaranteed by idle release generator 940, as described herein. When high-side FET 911 turns on, integrator reset switch 925 is off, and switch voltage VSW goes up to VIN (precisely VIN−(hsFET−Ron*(inductor current in output inductor 916), but hsFET−Ron=0 is assumed for easier explanation). (VIN−Vout)/Rint current discharges the integrator output from initial voltage=Vout with a slope of (VIN−Vout)/(Rint*Cint), which mimics the inductor current slope=((VIN−Vout)/(inductance value)) during hs_on; it is equal slope when a constant inductor value is replaced by a constant Rint*Cint. When low-side FET 912 turns on, switch voltage VSW goes down to 0V (precisely pvss−(1sFET−Ron*the inductor current), but 1sFET−Ron=0 is assumed for easier explanation). Thus, Vout/Rint current charges the integrator output with a slope of (Vout/(Rint*Cint)), which also mimics the inductor current slope=(Vout/inductance value) during ls_on. In DCM, the inductor current starts from 0 A and needs to end at 0 A, as determined by ZCD 900. Thus, during ls_on, as the integrator output voltage returns to the initial integrator output voltage=Vout, ZCD 900, and in particular, ZCD integrator 920, indicates the zero cross detect point by generating zero-crossing detect signal 928. Output comparator 927 is configured to detect and indicate when the integrator output crosses Vout for the zero-crossing point.

In some embodiments, ZCD integrator 920 is configured to operate only in DCM; the output current in output inductor 916 needs to start at 0 A and end at 0 A to complete a full switching cycle. In such embodiments, idle release generator 940 is used to guarantee such DCM operation. For example, when low-side FET 912 turns off, positive leftover output current (e.g., flows from VSW to Vout) is discharged by low-side FET 912 body diode 914 and switch voltage VSW becomes equal to (−) body diode voltage. If the output current is negative (e.g., flows from Vout to VSW), it is discharged by high-side FET 911 body diode 913 and switch voltage VSW becomes equal to body diode voltage+VIN. Thus, if switch voltage VSW is between idle mode threshold voltage Vx and VIN, the left-over output current has been fully discharged by body diode 913 or body diode 914, and power stage 910 is ready for the next DCM switching cycle. In various embodiments, DC-DC converter controller 120/320 may be configured to hold or maintain the idle mode (e.g., both high-side FET 911 and low-side FET 912 off) until switch voltage VSW is between Vx and VIN, as reported by release_idle_time signal, in order to guarantee DCM operation. In general, idle mode threshold voltage Vx is between ground and Vout and, in some embodiments, may be greater than Vth (e.g., the body diode threshold voltage, approximately 700 mV).

The output current in output inductor 916 when low-side FET 912 turns off (e.g., the ZCD error current) can vary due to non-idealities: op-amp offset, comparator offset and delay, pre-driver delay, propagation delay, thermal drift, and/or other non-idealities. Thus, ZCD offset calibrator 930 is configured to generate ZCD calibration offset 935, which is then added to the Vout side of output comparator 927 to make the ZCD error current as small as possible for optimum DC-DC converter efficiency. When low-side FET 912 turns off, the ls_off_detect signal trips high and current direction detector 933 is triggered to sample VSW and determine whether the sampled VSW is higher than Vref. If VSW is lower than Vref (cur_dir=high), the ZCD error current is positive (e.g., flows from VSW to Vout) because the ZCD error current is discharged through/by low-side FET 912 body diode 914. If VSW is higher than Vref (cur_dir=low), the ZCD error inductor current is negative (e.g., flows from Vout to VSW) because the ZCD error current is discharged through through/by high-side FET 911 body diode 913. Positive/negative ZCD error current direction signal (cur_dir) is sampled by calibration controller 934, as triggered by the zcd_cal_clk signal, which may be a delayed logic signal based on the ls_off_detect signal, as shown. Calibration controller 934 may be configured to use the sampled output current direction (e.g., the cur_dir signals) to update ZCD calibration offset 935 (zcd_offset<a:0>), which is provided to ZCD integrator 920 to reduce the ZCD error current incrementally/literately in the next switching cycle. Calibration controller 934 may be configured to implement a variety of different processes to generate and/or update ZCD calibration offset 935. One such process to update ZCD calibration offset 935 is shown as pseudocode within the block depicting calibration controller 934 of FIG. 9. Another process to update ZCD calibration offset 935, implemented as a state machine executed by calibration controller 934, is illustrated by FIG. 10.

Figure 10:
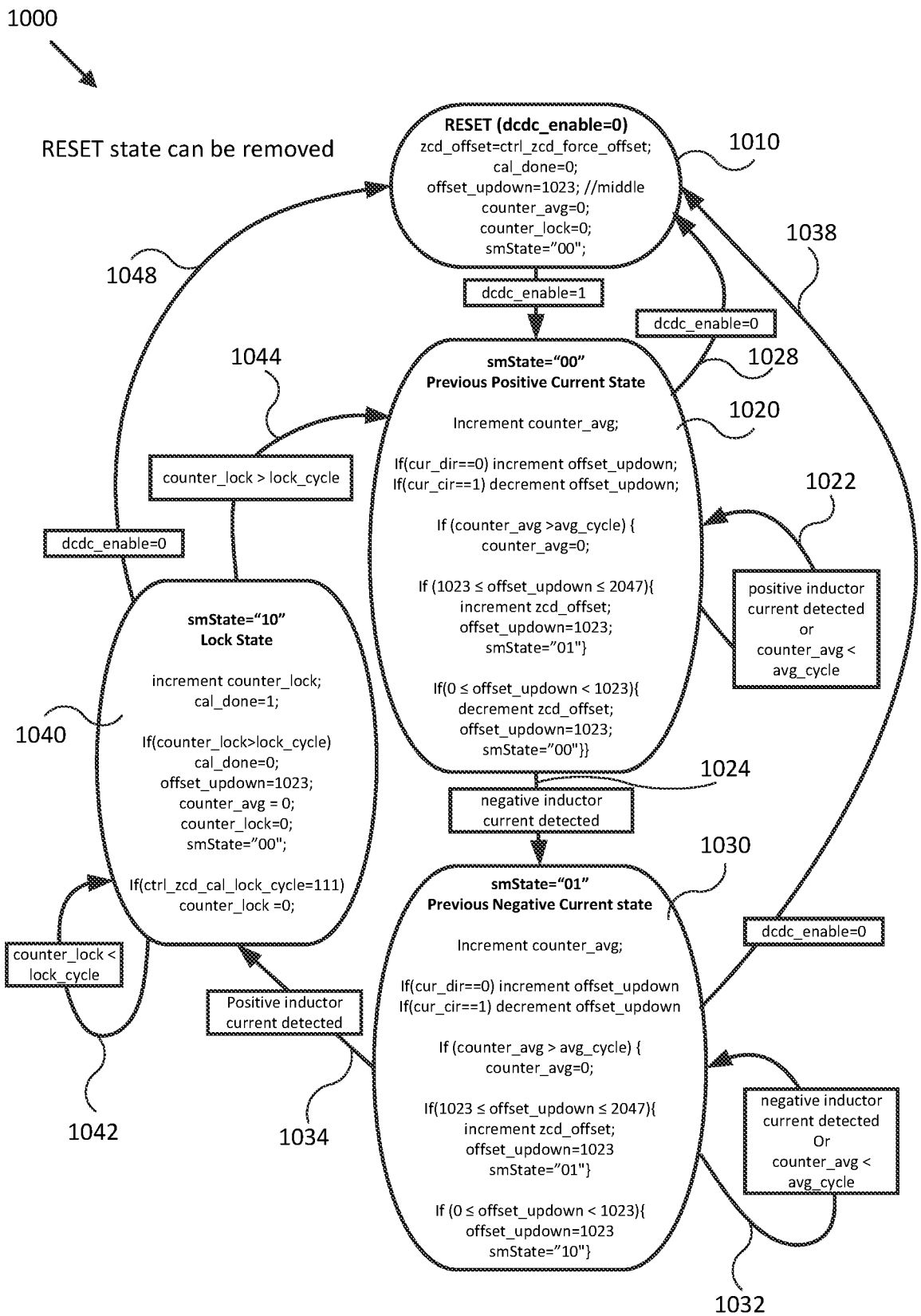
FIG. 10 is a flow diagram illustrating a process implementing a state machine for operating a ZCD for a DC-DC converter, in accordance with one or more embodiments of the disclosure.

FIG. 10 is a flow diagram illustrating a process 1000 implementing a state machine (e.g., blocks 1010, 1020, 1030, 1040) for operating ZCD 900 for DC-DC converter 100, 200, and/or 300, in accordance with one or more embodiments of the disclosure. To prevent glitches in the cur_dir signal from resulting in unreliable updates of ZCD calibration offset 935 (zcd_offset<a:0>), calibration controller 934 may be configured to sample 'avg_cycle' number of cycles of cur_dir and average the samples before updating ZCD calibration offset 935 (zcd_offset<a:0>). If more cur_dir=high samples are detected than cur_dir=low samples over the 'avg_cycle' cycles, calibration controller 934 may decrement zcd_offset<a:0> to reduce the ZCD error current level for the next switching cycle. If more cur_dir=low samples are detected than cur_dir=high samples over the 'avg_cycle' cycles, calibration controller 934 may increment zcd_offset<a:0> to increase the ZCD error current level for the next switching cycle. Eventually, ZCD calibration offset 935 will oscillate between the minimum positive ZCD error current zcd_offset value and the minimum negative ZCD error current zcd_offset value. Negative ZCD error current transients degrade DC-DC converter efficiency, relative to positive ZCD error current transients, and so calibration controller 934 may be configured to determine the zcd_offset value associated with the ZCD error current crossing from negative to positive and locking the minimum positive ZCD error current zcd_offset<a:0> value for 'lock_cycle' number of cycles. After 'lock_cycle' cycles, calibration controller 934 may be configured to sample cur_dir again to update zcd_offset<a: 0> to compensate for possible temperature changes, voltage changes, and/or other non-idealities.

More particularly, process 1000 represents a state machine used to generate ZCD calibration offset 935. At block 1010, calibration controller 934 initializes and/or resets various state variables to initial values configured to ensure proper operation of state machine 1000, such as disabling execution of state machine 1000 (dcdc_enable=0) (e.g., to block state variables from being changed by state machine 1000), setting ZCD calibration offset 935 to an initial, previously stored, or desired value (e.g., zcd_offset=ctrl_zcd_force_offset), and setting various other state variables to initial values in preparation of enabling state machine 1000. Upon receiving or detecting an enable signal (dcdc_enable=1), state machine 1000 proceeds to the initial state smState="00" represented as block 1020.

At block 1020, calibration controller 934 may be configured to receive a current direction of the output current (e.g., cur_dir) in output inductor 916 and increment or decrement a current direction counter (offset_updown) based on the current direction. If the current direction is positive, calibration controller 934 loops within block 1020 via loop 1022 to (effectively) average the current direction counter (e.g., for avg_cycle number of cycles). Upon completion of the average, calibration controller 934 increments or decrements ZCD calibration offset 935 and either proceeds to block 1030 (e.g., if ZCD calibration offset 935 is incremented) or begins another average loop through block 1020 (e.g., if ZCD calibration offset 935 is decremented). If the received current direction (cur_dir) is negative, calibration controller 934 proceeds along state transition 1024 to block 1030, as shown.

At block 1030, calibration controller 934 may be configured to receive a current direction of the output current in output inductor 916 and increment or decrement current direction counter (offset_updown) based on the current direction, similar to block 1020. If the current direction is positive, calibration controller 934 proceeds along state transition 1034 to block 1040. If the current direction is negative, calibration controller 934 loops within block 1030 via loop 1032 to finish averaging the current direction counter (e.g., for avg_cycle number of cycles). Upon completion of the average, calibration controller 934 either increments ZCD calibration offset 935 and begins another average loop through block 1030 (e.g., if the current direction counter indicates the current direction is still negative) or proceeds to block 1040. If the received current direction (cur_dir) is positive, calibration controller 934 proceeds to block 1040, as shown.

At block 1040, calibration controller 934 may be configured to lock ZCD calibration offset 935 for a number (lock_cycle) of switching cycles via loop 1042 in order to stabilize ZCD calibration offset 935 once the current direction is detected as minimally positive (e.g., relative to the available resolution of ZCD calibration offset 935) after being negative in an immediately preceding increment of ZCD calibration offset 935 (e.g., via operation of blocks 1020 and 1030). Calibration controller 934 may be configured to proceed along state transition 1044 back to block 1020 after looping within block 1040 (lock_cycle) switching cycles, as shown. In addition, calibration controller 934 may be configured to proceed to reset block 1010 via state transitions 1028, 1038, and/or 1048 upon detecting disabling execution of state machine 1000 (dcdc_enable=0). In various embodiments, state machine 1000 may be implemented without reset block 1010 and various state variables may be initialized and/or reset within block 1020 and/or block 1040, as shown.

Figure 11:
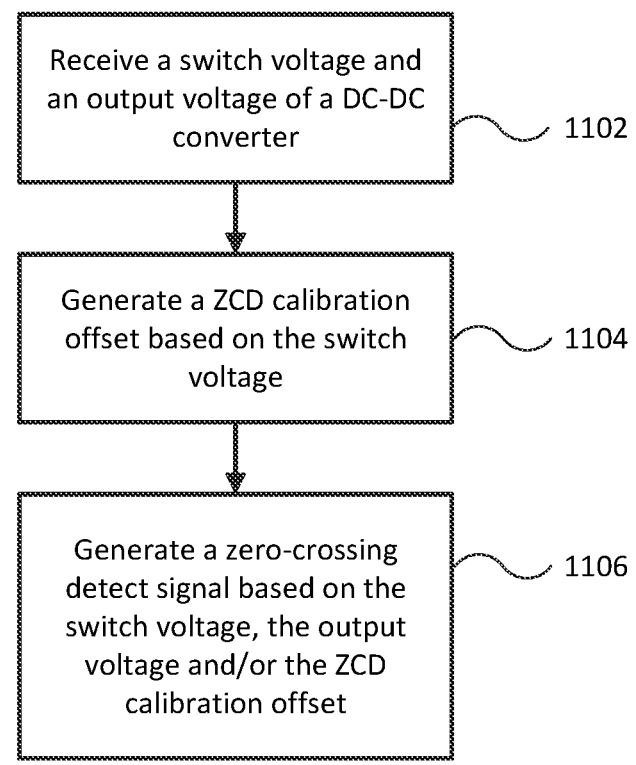
FIG. 11 is a flow diagram illustrating a process for operating a ZCD for a DC-DC converter, in accordance with one or more embodiments of the disclosure.

FIG. 11 is a flow diagram illustrating a process for operating a ZCD for a DC-DC converter, in accordance with one or more embodiments of the disclosure. In particular, process 1100 illustrates operation of ZCD 900 within DC-DC converters 100, 200, and/or 300. In various embodiments, the operations of FIG. 11 may be implemented as software instructions executed by one or more logic devices or controllers associated with corresponding methods, electronic devices, sensors, and/or structures depicted in FIGS. 1-10. More generally, the operations of FIG. 11 may be implemented with any combination of software instructions, mechanical elements, and/or electronic hardware (e.g., inductors, capacitors, amplifiers, actuators, or other analog and/or digital components). Any step, sub-step, sub-process, or block of process 1100 may be performed in an order or arrangement different from the embodiment illustrated by FIG. 11, and process 1100 may be implemented as a control loop configured to iterate through one or more steps, sub-steps, sub-processes, or blocks of process 1100 and return to a previous step, sub-step, sub-process, or block of process 1100 to iterate through process 1100 one or more additional times. For example, in other embodiments, one or more blocks may be omitted from or added to process 1100. Furthermore, block inputs, block outputs, various sensor signals, sensor information, calibration parameters, and/or other operational parameters may be stored to one or more memories prior to moving to a following portion of a corresponding process. Although process 1100 is described with reference to systems and methods described in FIGS. 1-10, process 1100 may be performed by other systems different from those systems and including a different selection of electronic devices, sensors, assemblies, mechanisms, systems, and/or system attributes.

At block 1102, ZCD 900 receives switch voltage VSW and output voltage Vout. For example, any one or combination of ZCD integrator 920, ZCD offset calibrator 930, and/or idle release generator 940 may be configured to receive switch voltage VSW and/or output voltage Vout from power stage 910 of DC-DC converters 100, 200, and/or 300. In some embodiments, DC-DC converter controller 120 or 320 may be configured to selectively enable ZCD 900 prior to operation of ZCD 900, based, at least in part, on output voltage Vout and/or an output load status of DC-DC converter 100, 200, or 300, such as through operation of vout_islow_latch and/or Heavy_load_status and OR gate (or 1) in FIG. 3. Such enablement may be configured to power/depower various elements of ZCD 900, such as 929 of ZCD integrator 920, calibration controller 934 of ZCD offset calibrator 930, and/or other logic and/or comparator elements of ZCD 900, as shown in FIG. 9.

At block 1104, ZCD 900 generates ZCD calibration offset 935. For example, ZCD offset calibrator 930 may be configured to generate ZCD calibration offset 935 based, at least in part, on switch voltage VSW received in block 1102. In various embodiments, ZCD offset calibrator 930 may be configured to implement state machine 1000 of FIG. 10, for example, or to implement the pseudocode presented within the block depicting calibration controller 934 in FIG. 9, and/or any of the alternative processes described herein. In particular embodiments, such as when ZCD offset calibrator 930 is first initialized, and prior to DC-DC converter 100, 200, and/or 300 completing a first switching cycle (e.g., idle→hs_on=high, ls_on=low→hs_on=low, ls_on=high→idle), ZCD offset calibrator 930 may be configured to generate ZCD calibration offset 935 based on an initialization value and/or a previously determined value (e.g., ctrl_zcd_force_offset, or a value stored and/or retrieved by calibration controller 934 during prior operation of ZCD offset calibrator 930), as described herein.

At block 1106, ZCD 900 generates zero-crossing detect signal 928. For example, ZCD integrator 920 may be configured to generate zero-crossing detect signal 928 based, at least in part, on switch voltage VSW and/or output voltage Vout received in block 1102, and/or on ZCD calibration offset 935 generated in block 1104. In some embodiments, DC-DC converter controller 120 or 320 may be configured to receive zero-crossing detect signal 928 (e.g., 'zero cross detect' in FIG. 3) and to generate switch control signals (e.g., ls_on, hs_on) to adjust a switching frequency of power stage 910 based, at least in part, on a peak current target value (e.g., provided by output load sensor 330) and/or zero-crossing detect signal 928 generated by ZCD integrator 920 of ZCD 900.

In particular embodiments, such as when ZCD offset calibrator 930 is first initialized, and prior to DC-DC converter 100, 200, and/or 300 completing a first switching cycle, ZCD integrator 920 may be configured to generate zero-crossing detect signal 928 based, at least in part, on switch voltage VSW and/or output voltage Vout received in block 1102, and/or on ZCD calibration offset 935 set to an initialization and/or previously determined value in block 1104. In subsequent switching cycles, ZCD integrator 920 may be configured to generate zero-crossing detect signal 928 based, at least in part, on switch voltage VSW and/or output voltage Vout received for a current switching cycle [n] of the DC-DC converter and/or ZCD calibration offset 935 generated by ZCD offset calibrator 930 at the end of a previous switching cycle [n−1] based on the ZCD error current sampled by calibration controller 934, as described herein.

Figure 12:
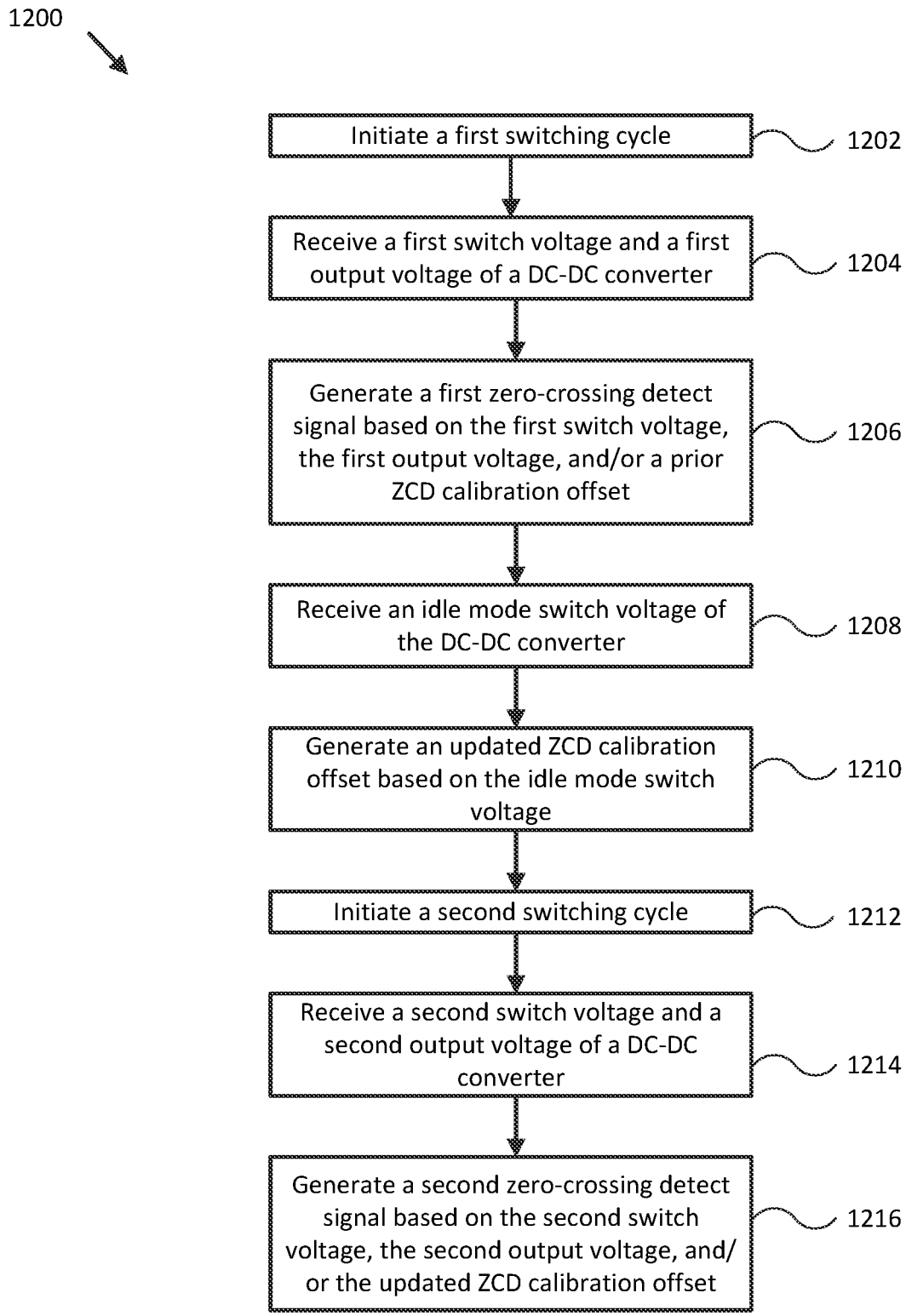
FIG. 12 is a flow diagram illustrating a process for operating a ZCD for a DC-DC converter, in accordance with one or more embodiments of the disclosure.

For example, FIG. 12 is a flow diagram illustrating a process for operating a ZCD for a DC-DC converter, in accordance with one or more embodiments of the disclosure. In particular, process 1200 illustrates operation of ZCD 900 within DC-DC converters 100, 200, and/or 300, with additional order and timing detail over that provided in FIG. 11. In various embodiments, the operations of FIG. 12 may be implemented as software instructions executed by one or more logic devices or controllers associated with corresponding methods, electronic devices, sensors, and/or structures depicted in FIGS. 1-11. More generally, the operations of FIG. 12 may be implemented with any combination of software instructions, mechanical elements, and/or electronic hardware (e.g., inductors, capacitors, amplifiers, actuators, or other analog and/or digital components). Any step, sub-step, sub-process, or block of process 1200 may be performed in an order or arrangement different from the embodiment illustrated by FIG. 12, and process 1200 may be implemented as a control loop configured to iterate through one or more steps, sub-steps, sub-processes, or blocks of process 1200 and return to a previous step, sub-step, sub-process, or block of process 1200 to iterate through process 1200 one or more additional times. For example, in other embodiments, one or more blocks may be omitted from or added to process 1200. Furthermore, block inputs, block outputs, various sensor signals, sensor information, calibration parameters, and/or other operational parameters may be stored to one or more memories prior to moving to a following portion of a corresponding process. Although process 1200 is described with reference to systems and methods described in FIGS. 1-11, process 1200 may be performed by other systems different from those systems and including a different selection of electronic devices, sensors, assemblies, mechanisms, systems, and/or system attributes.

At block 1202, DC-DC converter controller 120 or 320 initiates a first switching cycle. For example, DC-DC converter controller 320 may be configured to detect that Vout is less than Vref, thereby tripping comp1 high and setting high-side control signal hs_on=high to turn on high-side FET/switch 911. Prior to initiating block 1202, ZCD 900 may be configured to initialize ZCD calibration offset 935 to an initialization value and/or a previously determined value (e.g., ctrl_zcd_force_offset, or a value stored and/or retrieved by calibration controller 934 during prior operation of ZCD offset calibrator 930), as described herein.

At block 1204, ZCD 900 receives a first switch voltage VSW and a first output voltage Vout. For example, any one or combination of ZCD integrator 920, ZCD offset calibrator 930, and/or idle release generator 940 may be configured to receive first switch voltage VSW and/or first output voltage Vout from power stage 910 of DC-DC converters 100, 200, and/or 300. In some embodiments, DC-DC converter controller 120 or 320 may be configured to selectively enable ZCD 900 prior to operation of ZCD 900, based, at least in part, on output voltage Vout and/or an output load status of DC-DC converter 100, 200, or 300, such as through operation of vout_islow_latch and/or Heavy_load_status and OR gate (or1) in FIG. 3. Such enablement may be configured to power/depower various elements of ZCD 900, such as 929 of ZCD integrator 920, calibration controller 934 of ZCD offset calibrator 930, and/or other logic and/or comparator elements of ZCD 900, as shown in FIG. 9.

Upon high-side control signal hs_on being set high, ZCD integrator 920 exits a reset state where the integrator output is initially set to Vout and begins to discharge integrator capacitor 922, as described herein. Peak current detector 324 then trips high as the peak current through output inductor 916 is reached, and DC-DC converter controller 320 sets high-side control signal hs_on=low and low-side control signal ls_on=high to turn off high-side FET/switch 911 and turn on low-side FET/switch 912. ZCD integrator 920 then begins to charge integrator capacitor 922, as described herein, and the integrator output approaches Vout.

At block 1206, ZCD 900 generates first zero-crossing detect signal 928. For example, ZCD integrator 920 may be configured to generate first zero-crossing detect signal 928 based, at least in part, on first switch voltage VSW and/or first output voltage Vout initially received in block 1204, and/or on ZCD calibration offset 935 initialized in block 1202. In particular, ZCD output comparator 927 may trip zero-crossing detect signal 928 high when the integrator output=Vout+ZCD calibration offset 935 (as combined by ZCD offset calibration applicator 926). In some embodiments, DC-DC converter controller 120 or 320 may be configured to receive first zero-crossing detect signal 928 (e.g., 'zero cross detect' in FIG. 3) and to generate switch control signals (e.g., ls_on, hs_on) to adjust a switching frequency of power stage 910 based, at least in part, on a peak current target value (e.g., provided by output load sensor 330) and/or first zero-crossing detect signal 928 generated by ZCD integrator 920 of ZCD 900. Upon first zero-crossing detect signal 928 being generated, DC-DC converter controller 320 sets low-side control signal is on=low to turn off low-side FET/switch 912 and cause DC-DC converter 300 to enter an idle mode.

At block 1208, ZCD 900 receives an idle mode switch voltage VSW. For example, ZCD offset calibrator 930 may be configured to receive switch voltage VSW approximately when low-side FET/switch 912 turns off (e.g., before VSW reaches a steady state during the idle mode). In a particular embodiment, ZCD offset calibrator 930 may be configured to determine that low-side control signal is on=low and/or that low-side FET/switch 912 is off via low-side FET off detector 931 and sample switch voltage VSW using current direction detector 933 approximately at the beginning of the idle mode (e.g., during the idle mode resulting from low-side FET/switch 912 being turned off), thereby receiving an initial idle mode switch voltage VSW and determining whether the corresponding ZCD error current is positive or negative, as represented by current direction signal cur_dir generated by current direction detector 933.

At block 1210, ZCD 900 generates an updated ZCD calibration offset 935. For example, ZCD offset calibrator 930 may be configured to generate an updated ZCD calibration offset 935 based, at least in part, on the initial idle switch voltage VSW received in block 1208. In various embodiments, ZCD offset calibrator 930 may be configured to implement state machine 1000 of FIG. 10, for example, or to implement the pseudocode presented within the block depicting calibration controller 934 in FIG. 9, and/or any of the alternative processes described herein. In some embodiments, calibration controller 934 may be configured to receive current direction signal cur_dir and generate ZCD calibration offset 935 based, at least in part, on current direction signal cur_dir, where ZCD calibration offset 935 is iteratively driven towards a value configured to reduce the magnitude of the ZCD error current and, eventually, to a value resulting in a minimum positive ZCD error current for optimum DC-DC converter efficiency, as described herein. In various embodiments, DC-DC converter controller 320 may be configured to maintain the idle mode until idle release generator 940 generates idle release signal 947 (e.g., release_idle_time=high) and provides it to an input AND gate (DCM_and in FIG. 3) of DC-DC converter controller 320 to guarantee DCM operation of DC-DC converter 300, as also described herein.

At block 1212, DC-DC converter controller 120 or 320 initiates a second switching cycle. For example, DC-DC converter controller 320 may be configured to detect that Vout is less than Vref, thereby tripping comp1 high and setting high-side control signal hs_on=high to turn on high-side FET/switch 911, for a second time.

At block 1214, ZCD 900 receives a second switch voltage VSW and a second output voltage Vout. For example, any one or combination of ZCD integrator 920, ZCD offset calibrator 930, and/or idle release generator 940 may be configured to receive second switch voltage VSW and/or second output voltage Vout from power stage 910 of DC-DC converters 100, 200, and/or 300. In some embodiments, DC-DC converter controller 120 or 320 may be configured to selectively enable ZCD 900 prior to operation of ZCD 900, based, at least in part, on output voltage Vout and/or an output load status of DC-DC converter 100, 200, or 300, such as through operation of vout_islow_latch and/or Heavy_load_status and OR gate (or1) in FIG. 3. Upon high-side control signal hs_on being set high, ZCD integrator 920 exits a reset state where the integrator output is initially set to Vout and begins to discharge integrator capacitor 922, as described herein. Peak current detector 324 then trips high as the peak current through output inductor 916 is reached, and DC-DC converter controller 320 sets high-side control signal hs_on=low and low-side control signal ls_on=high to turn off high-side FET/switch 911 and turn on low-side FET/switch 912. ZCD integrator 920 then begins to charge integrator capacitor 922, as described herein, and the integrator output approaches Vout, all similar to the process described with respect to block 1204.

At block 1216, ZCD 900 generates second zero-crossing detect signal 928. For example, ZCD integrator 920 may be configured to generate second zero-crossing detect signal 928 based, at least in part, on second switch voltage VSW and/or second output voltage Vout initially received in block 1214, and/or on updated ZCD calibration offset 935 generated in block 1210. In particular, ZCD output comparator 927 may trip zero-crossing detect signal 928 high when the integrator output=Vout+ZCD calibration offset 935 (as combined by ZCD offset calibration applicator 926). In some embodiments, DC-DC converter controller 120 or 320 may be configured to receive second zero-crossing detect signal 928 (e.g., 'zero cross detect' in FIG. 3) and to generate switch control signals (e.g., ls_on, hs_on) to adjust a switching frequency of power stage 910 based, at least in part, on a peak current target value (e.g., provided by output load sensor 330) and/or second zero-crossing detect signal 928 generated by ZCD integrator 920 of ZCD 900. Upon second zero-crossing detect signal 928 being generated, DC-DC converter controller 320 sets low-side control signal ls_on=low to turn off low-side FET/switch 912 and cause DC-DC converter 300 to enter an idle mode. Process 1200 may then loop back to block 1210 to update ZCD calibration offset ZCD calibration offset 935 for a next switching cycle, as described herein.

Accordingly, embodiments are able to increase the overall efficiency of DC-DC converters through use of a highly reliable and accurate and relatively low power ZCD configured to help control the timing of the various modes, cycles, and switching in the DC-DC converters, as described herein. Moreover, embodiments are able to do so while adaptively servicing higher load currents, reducing risk of output voltage ripple at relatively low load currents, and reducing risk of switching interference in downstream devices powered by the DC-DC converters.

The electronic or electric devices and/or any other relevant devices or components according to embodiments of the present invention described herein may be implemented utilizing any suitable hardware, firmware (e.g. an application-specific integrated circuit), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

The invention claimed is:

1. A zero-crossing detector (ZCD) for a direct current to direct current (DC-DC) converter, the ZCD comprising:
   a ZCD integrator including:
      a differential voltage integrator configured to receive a switch voltage and an output voltage of a power stage of the DC-DC converter and to generate an integrator output based on the switch voltage and the output voltage o the power stage; and
      an output comparator configured to generate a zero-crossing detect signal based, at least in part, on the integrator output and the output voltage of the power stage, wherein the zero-crossing detect signal indicates whether an output current in an output inductor of the power stage of the DC-DC converter is approximately zero.

2. The ZCD of claim 1, wherein the ZCD integrator comprises:
   an integrator reset switch configured to reset the differential voltage integrator during an idle mode of the DC-DC converter; and
   a ZCD offset calibration applicator configured to receive the output voltage and a ZCD calibration offset and provide a corresponding calibrated output voltage to the output comparator, wherein the calibrated output voltage is configured to compensate for operational non-idealities associated with operation of the DC-DC converter.

3. The ZCD of claim 1, further comprising:
   a ZCD offset calibrator configured to receive the switch voltage and generate a ZCD calibration offset based, at least in part, on the received switch voltage;
   wherein the ZCD integrator is configured to generate the zero-crossing detect signal based, at least in part, on the ZCD calibration offset.

4. The ZCD of claim 3, wherein the ZCD offset calibrator comprises:
   a current direction detector configured to receive the switch voltage, compare the switch voltage to a reference voltage for the DC-DC converter approximately when a low-side switch of the power stage transitions to an off state, and generate a current direction signal based, at least in part, on the comparison of the switch voltage and the reference voltage; and
   a logic device configured to receive the current direction signal and generate the ZCD calibration offset based, at least in part, on the current direction signal, wherein the ZCD calibration offset is configured to adjust a timing of the zero-crossing detect signal in order to compensate for operational non-idealities associated with operation of the DC-DC converter.

5. The ZCD of claim 3, wherein the generating the ZCD calibration offset comprises:
   iteratively incrementing and/or decrementing the ZCD calibration offset based, at least in part, on a current direction of the output current in the output inductor determined approximately when a low-side switch of the power stage transitions to an off state;
   determining a negative to positive transition of the current direction after incrementing the ZCD calibration offset; and
   locking the ZCD calibration offset for a predetermined number of cycles of the power stage.

6. The ZCD of claim 1, further comprising:
   an idle release generator configured to:
      receive the switch voltage and an input voltage for the power stage of the DC-DC converter; and
      generate an idle release signal based, at least in part, on the received switch voltage and input voltage, wherein the idle release signal is configured to indicate the DC-DC converter is ready to exit an idle mode of the DC-DC converter.

7. The ZCD of claim 6, wherein the idle release generator comprises:
   a first comparator configured receive the switch voltage and generate a first comparator output indicating the switch voltage is greater than an idle mode threshold voltage preselected to be between ground and the output voltage;
   a second comparator coupled to the first comparator output and configured to generate a second comparator output indicating the switch voltage is less than the input voltage, after the first comparator generates the first comparator output; and
   a logic device configured to generate the idle release signal based, at least in part, on the first and second comparator outputs.

8. The ZCD of claim 1, wherein the DC-DC converter comprises a discontinuous conduction mode (DCM) DC-DC converter, and wherein the power stage of the DCM DC-DC converter comprises:
   a high-side field effect transistor (FET) coupled between an input voltage of the DC-DC converter and an input side of the output inductor; and
   a low-side FET coupled between the input side of the output inductor and a ground for the DC-DC converter;
   wherein the switch voltage is measured at the input side of the output inductor, and wherein the high-side FET and the low-side FET are controlled by respective high-side and low-side control signals provided by a controller of the DC-DC converter.

9. A DC-DC converter comprising the ZCD of claim 1, wherein the DC-DC converter comprises:
   a DC-DC converter controller configured to receive the output voltage of the power stage of the DC-DC converter and generate switch control signals to control a switching frequency of the power stage; and
   an output load sensor configured to determine an output load status of the DC-DC converter, determine a peak current target value for the DC-DC converter based, at least in part, on the determined output load status, and provide the output load status and/or the peak current target value to the DC-DC converter controller, wherein the DC-DC converter controller is configured to:
      selectively enable the ZCD based, at least in part, on the output voltage and/or the output load status of the DC-DC converter provided by the output load sensor; and generate the switch control signals to adjust the switching frequency of the power stage based, at least in part, on the peak current target value provided by the output load sensor and/or the zero-crossing detect signal generated by the ZCD integrator.

10. A method of operating a zero-crossing detector (ZCD) for a direct current to direct current (DC-DC) converter, the method comprising:

receiving, by a ZCD integrator of the ZCD, a switch voltage and an output voltage of a power stage of the DC-DC converter;

generating, by the ZCD integrator, an integrator output based on the switch voltage and the output voltage of the power stage; and generating, by an output comparator, a zero-crossing detect signal based, at least in part, on the integrator output and the output voltage of the power stage, wherein the zero-crossing detect signal indicates whether an output current in an output inductor of the power stage of the DC-DC converter is approximately zero.

11. The method of claim 10, wherein the ZCD integrator comprises:

an integrator reset switch configured to reset the ZCD integrator during an idle mode of the DC-DC converter; and a ZCD offset calibration applicator configured to receive the output voltage and a ZCD calibration offset and provide a corresponding calibrated output voltage to the output comparator, wherein the calibrated output voltage is configured to compensate for operational non-idealities associated with operation of the DC-DC converter.

12. The method of claim 10, further comprising:

receiving, by a ZCD offset calibrator of the ZCD, the switch voltage; and generating a ZCD calibration offset based, at least in part, on the received switch voltage, wherein the generating the zero-crossing detect signal is based, at least in part, on the ZCD calibration offset.

13. The method of claim 12, wherein the ZCD offset calibrator comprises:

a current direction detector configured to receive the switch voltage, compare the switch voltage to a reference voltage for the DC-DC converter approximately when a low-side switch of the power stage transitions to an off state, and generate a current direction signal based, at least in part, on the comparison of the switch voltage and the reference voltage; and a logic device configured to receive the current direction signal and generate the ZCD calibration offset based, at least in part, on the current direction signal, wherein the ZCD calibration offset is configured to adjust a timing of the zero-crossing detect signal in order to compensate for operational non-idealities associated with operation of the DC-DC converter.

14. The method of claim 12, wherein the generating the ZCD calibration offset comprises:

iteratively incrementing and/or decrementing the ZCD calibration offset based, at least in part, on a current direction of the output current in the output inductor determined approximately when a low-side switch of the power stage transitions to an off state;

determining a negative to positive transition of the current direction after incrementing the ZCD calibration offset; and locking the ZCD calibration offset for a predetermined number of cycles of the power stage.

15. The method of claim 10, further comprising:

receiving, by an idle release generator, the switch voltage and an input voltage for the power stage of the DC-DC converter; and generating an idle release signal based, at least in part, on the received switch voltage and input voltage, wherein the idle release signal is configured to indicate the DC-DC converter is ready to exit an idle mode of the DC-DC converter.

16. The method of claim 15, wherein the idle release generator comprises:

a first comparator configured receive the switch voltage and generate a first comparator output indicating the switch voltage is greater than an idle mode threshold voltage preselected to be between ground and the output voltage;

a second comparator coupled to the first comparator output and configured to generate a second comparator output indicating the switch voltage is less than the input voltage, after the first comparator generates the first comparator output; and a logic device configured to generate the idle release signal based, at least in part, on the first and second comparator outputs.

17. The method of claim 10, wherein the DC-DC converter comprises a discontinuous conduction mode (DCM) DC-DC converter, and wherein the power stage of the DCM DC-DC converter comprises:

a high-side field effect transistor (FET) coupled between an input voltage of the DC-DC converter and an input side of the output inductor; and a low-side FET coupled between the input side of the output inductor and a ground for the DC-DC converter;

wherein the switch voltage is measured at the input side of the output inductor, and wherein the high-side FET and the low-side FET are controlled by respective high-side and low-side control signals provided by a controller of the DC-DC converter.

18. The method of claim 10, further comprising A DC-DC converter comprising the ZCD of claim 1, wherein the DC-DC converter comprises:

selectively enabling the ZCD based, at least in part, on the output voltage and/or an output load status of the DC-DC converter provided by an output load sensor configured to determine the output load status of the DC-DC converter, determine a peak current target value for the DC-DC converter based, at least in part, on the determined output load status, and provide the output load status and/or the peak current target value to a DC-DC converter controller for the DC-DC converter; and generating, by the DC-DC converter controller, switch control signals to adjust a switching frequency of the power stage of the DC-DC converter based, at least in part, on the peak current target value provided by the output load sensor and/or the zero-crossing detect signal generated by the ZCD integrator.

* * * * *

UNITED STATES PATENT AND TRADEMARK OFFICE
CERTIFICATE OF CORRECTION

| | |
|---|---|
| PATENT NO. | : 11,264,977 B1 |
| APPLICATION NO. | : 17/184409 |
| DATED | : March 1, 2022 |
| INVENTOR(S) | : Jae Won Choi et al. |

It is certified that error appears in the above-identified patent and that said Letters Patent is hereby corrected as shown below:

On the Title Page

At Item (72), at inventor number five, delete "Ketan Patel, Irvine, CA (US)" and insert -- Ketankumar B. Patel, Irvine, CA (US) --

Signed and Sealed this
Second Day of August, 2022

Katherine Kelly Vidal
*Director of the United States Patent and Trademark Office*